(12) United States Patent
Lee et al.

(10) Patent No.: US 12,042,031 B2
(45) Date of Patent: Jul. 23, 2024

(54) CASE FOR FOLDABLE ELECTRONIC DEVICE

(71) Applicant: Samsung Electronics Co., Ltd., Suwon-si (KR)

(72) Inventors: Jemin Lee, Suwon-si (KR); Dusang Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 374 days.

(21) Appl. No.: 17/647,106

(22) Filed: Jan. 5, 2022

(65) Prior Publication Data
US 2022/0125172 A1   Apr. 28, 2022

Related U.S. Application Data

(63) Continuation of application No. PCT/KR2020/008618, filed on Jul. 1, 2020.

(30) Foreign Application Priority Data

Jul. 5, 2019   (KR) .................. 10-2019-0081655

(51) Int. Cl.
  *A45C 13/00*   (2006.01)
  *A45C 11/00*   (2006.01)
  *G09F 9/30*    (2006.01)

(52) U.S. Cl.
  CPC ............ *A45C 11/00* (2013.01); *A45C 13/005* (2013.01); *G09F 9/301* (2013.01); *A45C 2011/002* (2013.01); *A45C 2011/003* (2013.01)

(58) Field of Classification Search
  CPC . A45C 11/00; A45C 13/005; A45C 2011/002; A45C 2011/003; G09F 9/301
  See application file for complete search history.

(56) References Cited

U.S. PATENT DOCUMENTS

| 4,244,044 A    | 1/1981  | Olsson        |
| 2009/0295596 A1 | 12/2009 | Downey et al. |

(Continued)

FOREIGN PATENT DOCUMENTS

| EP | 2128724 A2    | 12/2009 |
| JP | 2005-100312 A | 4/2005  |

(Continued)

OTHER PUBLICATIONS

Office Action dated Sep. 26, 2023, in connection with Korean Patent Application No. 10-2019-0081655, 14 pages.

(Continued)

*Primary Examiner* — Keith Ferguson

(57) ABSTRACT

Various embodiments of the present disclosure provide a case for a foldable electronic device, comprising a first housing and a second housing rotatable with respect to the first housing. The case may comprise: a first cover at least partially covering the first housing; a second cover at least partially covering the second housing and rotatable with respect to the first cover; a driving unit for adjusting the angle between the first cover and the second cover; a communication unit for transmitting or receiving information relating to the angle to or from the foldable electronic device; and at least one processor connected to the communication unit so as to receive the information relating to the angle and drive the driving unit accordingly. Various other embodiments may be employed.

20 Claims, 17 Drawing Sheets

(56) References Cited

U.S. PATENT DOCUMENTS

| | | |
|---|---|---|
| 2015/0163572 A1 | 6/2015 | Weiss et al. |
| 2017/0047960 A1 | 2/2017 | Kil et al. |
| 2017/0212557 A1 | 7/2017 | Park et al. |
| 2018/0063981 A1 | 3/2018 | Park et al. |
| 2018/0227668 A1 | 8/2018 | Park et al. |
| 2019/0110744 A1 | 4/2019 | Zhu |
| 2020/0073446 A1* | 3/2020 | Wu .................. G06V 40/13 |
| 2020/0359145 A1 | 11/2020 | Kim et al. |

FOREIGN PATENT DOCUMENTS

| | | |
|---|---|---|
| JP | 2006-222559 A | 8/2006 |
| JP | 2008-301400 A | 12/2008 |
| KR | 10-0780731 B1 | 11/2007 |
| KR | 10-0891771 B1 | 4/2009 |
| KR | 10-1344806 B1 | 12/2013 |
| KR | 10-2014-0145068 A | 12/2014 |
| KR | 10-1612791 B1 | 4/2016 |
| KR | 10-1690524 B1 | 12/2016 |
| KR | 10-2017-0019965 A | 2/2017 |
| KR | 10-2017-0088565 A | 8/2017 |
| KR | 10-2018-0024632 A | 3/2018 |
| KR | 10-2018-0092219 A | 8/2018 |
| KR | 10-2019-0086899 A | 7/2019 |

OTHER PUBLICATIONS

International Search Report and Written Opinion of the International Searching Authority in connection with International Application No. PCT/KR2020/008618 issued Oct. 12, 2020, 11 pages.
International Search Report and Written Opinion of the International Searching Authority in connection with International Application No. PCT/KR2020/003056 issued Jun. 9, 2020, 9 pages.

* cited by examiner

CASE FOR FOLDABLE ELECTRONIC DEVICE

CROSS-REFERENCE TO RELATED APPLICATIONS

This application is a continuation of International Application No. PCT/KR2020/008618, filed Jul. 1, 2020, which is based on and claims priority to Korean Patent Application No. 10-2019-0081655 filed on Jul. 5, 2019, in the Korean Intellectual Property Office, the disclosures of which are incorporated by reference herein in their entirety.

BACKGROUND

1. Field

Various embodiments of the disclosure relate to a case capable of protecting a foldable electronic device and conveniently adjusting the angle of the foldable electronic device.

2. Description of Related Art

Recently, various types of electronic devices, such as mobile phones, tablet personal computers (tablet PCs), MP3 players, portable multimedia players (PMPs), and e-books, are available to allow users to enjoy various contents. Electronic devices come packed with various features, such as playing music, photos, videos, or other multimedia and playing games, let alone wireless telecommunications. As mobile communication services spread up to multimedia services, users may use multimedia services as well as voice calls or text messaging, on their electronic device.

Electronic devices become lighter and more compact for convenient carrying. Due to a likelihood of damage by physical external impact, an electronic device may be used along with a case. Not only does the case protect the electronic device, but it also may give the user aesthetic effects.

SUMMARY

Meanwhile, a display may be placed on one side of the electronic device to output a screen according to the operation of a certain function of the device. To rid the user of any inconvenience in using multimedia services, a trend is to pack an electronic device with a larger display panel. Recently, flexible display panel-equipped foldable electronic devices come along.

A foldable electronic device may be used in various statuses, e.g., a folded status, a partially unfolded (or partially folded) intermediate status, or an unfolded status, depending on the angle between two different housing structures constituting the foldable electronic device. The foldable electronic device may execute applications suitable for the various statuses by the user's operation.

Although differing from person to person, some specific applications may be used at some specific angles and, when used at the specific angles, allow the user to feel comfortable. To this end, when the two different housing structures included in the foldable electronic device form a specific angle, a specific application may be executed, or conversely, when a specific application is executed, the two different housing structures may be rendered to form a specific angle, which may lead to increased user convenience. According to some embodiments, even when the angle formed by two different housings of the foldable electronic device is automatically adjusted, the above object may be achieved.

However, if a device for enabling automatic angle adjustment is included in the foldable electronic device to achieve the above object, it may be difficult to achieve the objective of making the electronic device more compact or thinner.

Further, there is no technology for automatically adjusting the angle of a foldable electronic device in the foldable electronic device or, even if any, it is not commercially available yet.

According to various embodiments of the disclosure, there may be provided a case for a foldable electronic device. The case of the disclosure may protect the foldable electronic device from external impact while giving a better aesthetic feel and further may provide the user with higher convenience by including a configuration for automatically adjusting the angle of the foldable electronic device.

According to various embodiments of the disclosure, there may be provided a case for a foldable electronic device including a first housing and a second housing rotatable with the first housing, comprising a first cover surrounding at least a portion of the first housing, a second cover surrounding at least a portion of the second housing and rotatable about the first cover, a driver configured to adjust an angle between the first cover and the second cover, a communication unit configured to transmit information related to the angle for a folded status of the foldable electronic device to the foldable electronic device, or receive the information from the foldable electronic device and at least one processor coupled with the communication unit and configured to receive the information related to the angle to operate the driver.

According to various embodiments of the disclosure, there may be provided a case for a foldable electronic device including a first housing and a second housing rotatable with the first housing, comprising a first cover surrounding at least a portion of the foldable electronic device, a second cover surrounding at least a portion of the foldable electronic device and rotatable about the first cover, a sensor for detecting an angle between the first housing and the second housing, a driver for adjusting an angle between the first cover and the second cover, a communication unit for transmitting information related to the angle to the foldable electronic device, or receiving the information from the foldable electronic device, at least one processor coupled with the communication unit and, if the communication unit is activated, receiving the information related to the angle and driving the driver based on at least a portion of angle information detected between the first housing and the second housing, and a memory coupled with the processor, wherein the memory includes instructions that, when executed, enable the processor to operate the driver according to the information related to the angle to adjust the angle between the first cover and the second cover.

The case of the foldable electronic device according to various embodiments of the disclosure may increase user convenience by providing a function of automatically adjusting the angle formed by the foldable housing of the foldable electronic device.

The case of the foldable electronic device according to various embodiments of the disclosure may provide an optimized user environment by predicting the user environment and automatically adjusting the angle of the foldable electronic device according to the situation.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 19, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
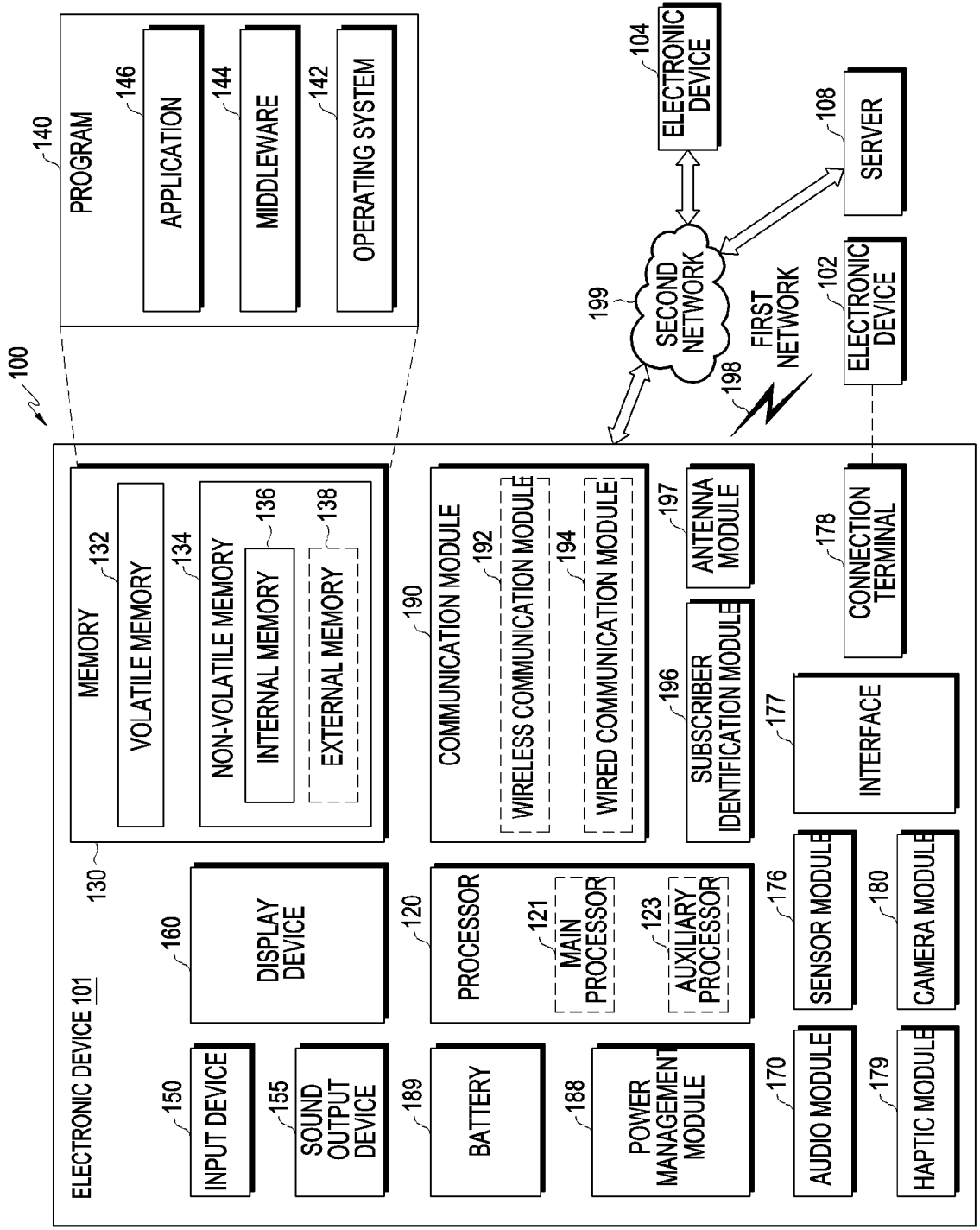
FIG. 1 is a block diagram illustrating an electronic device in a network environment according to various embodiments of the disclosure.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a near field wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a near field wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a near field communication network, such as Bluetooth, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device). According to an embodiment, the antenna module may include one antenna including a radiator formed of a conductor or conductive pattern formed on a substrate (e.g., a printed circuit board (PCB)). According to an embodiment, the antenna module 197 may include a plurality of antennas. In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197. At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
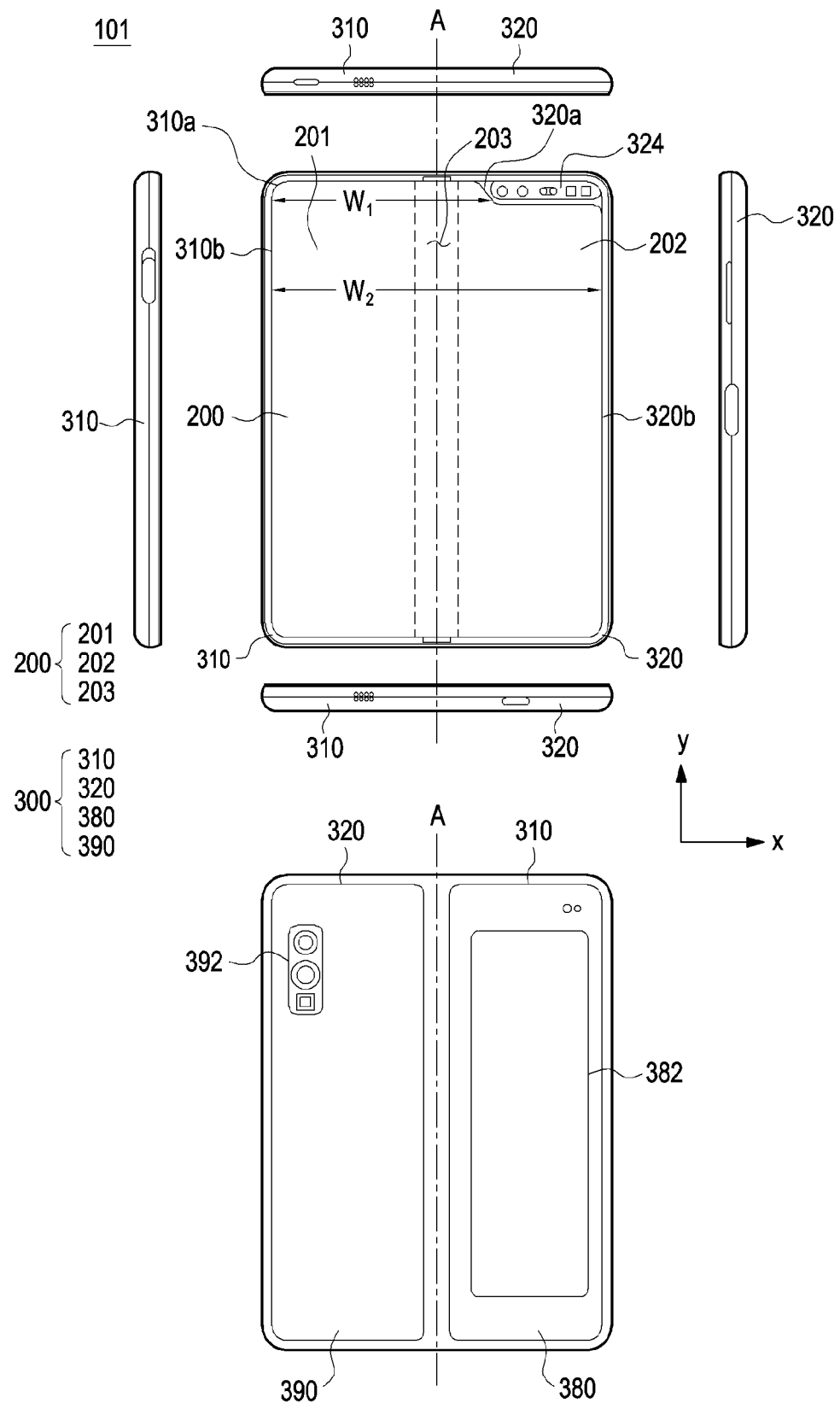
FIG. 2 is a view illustrating an unfolded status of an electronic device according to various embodiments of the disclosure.
Figure 3:
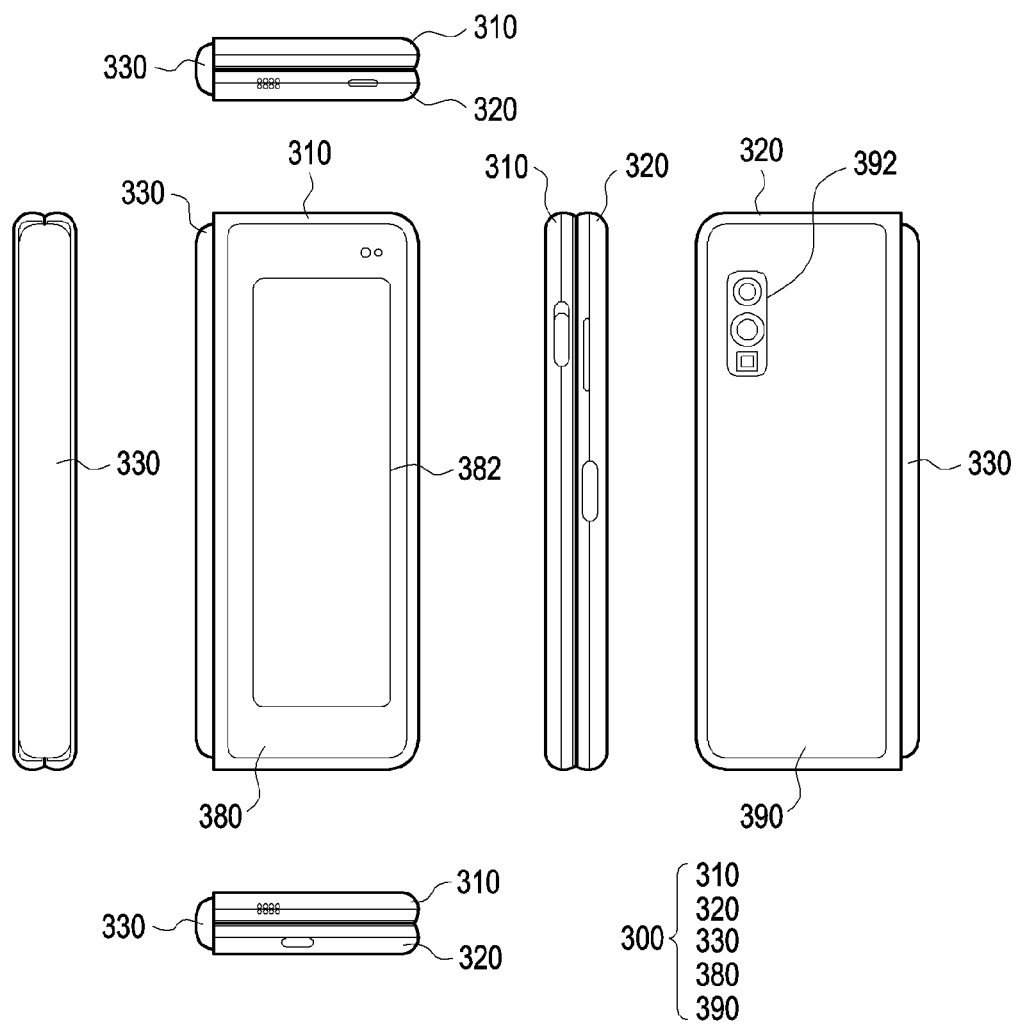
FIG. 3 is a view illustrating a folded status of an electronic device according to various embodiments of the disclosure.

FIG. 2 is a view illustrating an unfolded status of an electronic device according to various embodiments of the disclosure. FIG. 3 is a view illustrating a folded status of an electronic device according to various embodiments of the disclosure.

Referring to FIGS. 2 and 3, according to an embodiment, an electronic device 101 may include a foldable housing 300, a hinge cover 330 covering a foldable portion of the foldable housing 300, and a flexible or foldable display 200 (hereinafter, simply "display 200") (e.g., the display device 160 of FIG. 1) disposed in a space formed by the foldable housing 300. According to an embodiment, the surface on which the display 200 is disposed may be defined as a front surface of the electronic device 101. The opposite surface of the front surface may be defined as a rear surface of the electronic device 101. The surface surrounding the space between the front and rear surfaces may be defined as a side surface of the electronic device 101.

According to various embodiments, the foldable housing 300 may include a first housing 310, a second housing 320, a first rear cover 380, a second rear cover 390, and a hinge. (e.g., the hinge 510 of FIG. 4 to be described below). Here, the second housing 320 may include a sensor area 324. The foldable housing 300 of the electronic device 101 are not limited to the shape and coupling shown in FIGS. 2 and 3 but may rather be implemented in other shapes or via a combination and/or coupling of other components. For example, the first housing 310 and the first rear cover 380 may be integrally formed with each other, and the second housing 320 and the second rear cover 390 may be integrally formed with each other.

According to various embodiments, the first housing 310 may be connected to the hinge (e.g., the hinge 510 of FIG. 4 to be described below) and may include a first surface (e.g., the first surface 311 of FIG. 4) facing in a first direction and a second surface (e.g., the second surface 312 of FIG. 4 to be described below) facing in a second direction opposite to the first direction. The second housing 320 may be connected to the hinge 510 and may include a third surface (e.g., the third surface 321 of FIG. 4 to be described below) facing in a third direction and a fourth surface (e.g., the fourth surface 322 of FIG. 4 to be described below) facing in a fourth direction opposite to the third direction, and may rotate from the first housing 310 on the hinge 510 (or the folding axis A-A'). The electronic device 101 may transform into a folded status or an unfolded status, which is described below with reference to FIGS. 4, 5A and 5B. According to an embodiment, in the fully folded status of the electronic device 101, the first surface may face the third surface and, in the fully unfolded status, the third direction may be identical to the first direction.

According to various embodiments, the first housing 310 and the second housing 320 may be disposed on both sides of the folding axis A-A', and may have an overall shape with respect to the folding axis A-A'. As described below, the angle or distance between the first housing 310 and the second housing 320 may be varied depending on whether the electronic device 101 is in the unfolded status, the folded status, or the partially unfolded (or partially folded) intermediate status. According to an embodiment, the second housing 320 may further include the sensor area 324 in which various sensors are disposed, unlike the first housing 310. However, the other areas may be shaped to be symmetrical with each other.

According to various embodiments, as shown in FIG. 2, the first housing 310 and the second housing 320 together may form a recess to receive the display 200. In an embodiment, due to the sensor area 324, the recess may have two or more different widths in the direction perpendicular to the folding axis A-A'.

According to an embodiment, the recess may have a first width w1 between a first portion 310a of the first housing 310, which is parallel with the folding axis A-A', and a first portion 320a of the second housing 320, which is formed at an edge of the sensor area 324. The recess may have a second width w2 formed by a second portion 310b of the first housing 310 and a second portion 320b of the second housing 320, which does not correspond to the sensor area 324 and is parallel with the folding axis A-A'. In this case, the second width W2 may be longer than the first width W1. As another example, the first portion 310a of the first housing 310 and the first portion 320a of the second housing 320, which are asymmetrical with each other, may form the first width w1 of the recess, and the second portion 310b of the first housing 310 and the second portion 320b of the second housing 320, which are symmetrical with each other, may form the second width w2 of the recess. In an embodiment, the first portion 320a and second portion 320b of the second housing 320 may have different distances from the folding axis A-A'. The width of the recess is not limited thereto. According to another embodiment, the recess may have a plurality of widths due to the shape of the sensor area 324 or the asymmetric portions of the first housing structure 310 and the second housing 320.

According to various embodiments, at least a portion of the first housing 310 and the second housing 320 may be formed of a metal or a non-metal material having a predetermined degree of rigidity to support the display 200. At least a portion formed of metal may provide a ground plane of the electronic device 101 and may be electrically connected with a ground line formed on a printed circuit board (e.g., the board unit 520 of FIG. 4).

According to various embodiments, the sensor area 324 may be formed adjacent to a corner of the second housing 320 and to have a predetermined area. However, the placement, shape, or size of the sensor area 324 is not limited to those illustrated. For example, in another embodiment, the sensor area 324 may be provided in a different corner of the second housing 320 or in any area between the top corner and the bottom corner. In an embodiment, components for performing various functions, embedded in the electronic device 101, may be exposed through the sensor area 324 or one or more openings in the sensor area 324 to the front surface of the electronic device 101. In various embodiments, the components may include various kinds of sensors. The sensor may include at least one of, e.g., a front-facing camera, a receiver, or a proximity sensor.

According to various embodiments, the first rear cover 380 may be disposed on one side of the folding axis A-A' on the rear surface of the electronic device 101 and have, e.g., a substantially rectangular periphery which may be surrounded by the first housing 310. Similarly, the second rear cover 390 may be disposed on the opposite side of the folding axis A-A' on the rear surface of the electronic device 101 and its periphery may be surrounded by the second housing 320.

According to various embodiments, the first rear cover 380 and the second rear cover 390 may be substantially symmetrical in shape with respect to the folding axis A-A'. However, the first rear cover 380 and the second rear cover 390 are not necessarily symmetrical in shape. In another embodiment, the electronic device 101 may include the first rear cover 380 and the second rear cover 390 in various shapes. According to another embodiment, the first rear cover 380 may be integrally formed with the first housing 310, and the second rear cover 390 may be integrally formed with the second housing 320.

According to various embodiments, the first rear cover 380, the second rear cover 390, the first housing 310, and the second housing 320 may form a space where various components (e.g., a printed circuit board or battery) of the electronic device 101 may be disposed. According to an embodiment, one or more components may be arranged or visually exposed on/through the rear surface of the electronic device 101. For example, at least a portion of a sub display may be visually exposed through a first rear surface area 382 of the first rear cover 380. In another embodiment, one or more components or sensors may be visually exposed through a second rear surface area 392 of the second rear cover 390. According to various embodiments, the sensor may include a proximity sensor and/or a rear-facing camera.

According to various embodiments, a front camera exposed to the front surface of the electronic device 101 through one or more openings prepared in the sensor area 324 or a rear camera exposed through a second rear surface area 392 of the second rear cover 390 may include one or more lenses, an image sensor, and/or an image signal processor. The flash may include, e.g., a light emitting diode (LED) or a xenon lamp. According to an embodiment, two or more lenses (an infrared (IR) camera, a wide-angle lens, and a telescopic lens) and image sensors may be disposed on one surface of the electronic device 101.

Referring to FIG. 3, the hinge cover 330 may be disposed between the first housing 310 and the second housing 320 to hide the internal components (e.g., the hinge 510 of FIG. 4 described below). According to an embodiment, the hinge cover 330 may be hidden by a portion of the first housing 310 and second housing 320 or be exposed to the outside depending on the state (e.g., the unfolded status, intermediate status, or folded status) of the electronic device 101.

According to an embodiment of the present invention, as shown in FIG. 2, in the unfolded status (e.g., a fully unfolded status) of the electronic device 101, the hinge cover 330 may be hidden not to be exposed by the first housing 310 and the second housing 320. As another example, as shown in FIG. 3, in the folded status (e.g., a fully folded status) of the electronic device 101, the hinge cover 330 may be exposed to the outside between the first housing 310 and the second housing 320. As another example, in an intermediate status in which the first housing 310 and the second housing 320 are folded with a certain angle, the hinge cover 330 may be partially exposed to the outside between the first housing 310 and the second housing 320. In this case, however, the exposed area may be smaller than in the fully folded status. According to an embodiment, the hinge cover 330 may include a curved surface.

According to various embodiments, the display 200 may be disposed in a space formed by the foldable housing 300. For example, the display 200 may be seated in a recess formed by the foldable housing 300 and may be seen from the outside through the front surface of the electronic device 101. For example, the display 200 may constitute most of the front surface of the electronic device 101. Thus, the front surface of the electronic device 101 may include the display 200 and a partial area of the first housing 310 and a partial area of the second housing 320, which are adjacent to the display 200. The rear surface of the electronic device 101 may include the first rear cover 380, a partial area of the first housing 310, which is adjacent to the first rear cover 380, the second rear cover 390, and a partial area of the second housing 320, which is adjacent to the second rear cover 390.

According to various embodiments, the display 200 may mean a display at least a portion of which may be transformed into a flat or curved surface. According to an embodiment, the display 200 may include a folding area 203, a first area 201 disposed on one side of the folding area 203 (e.g., the left side of the folding area 203 of FIG. 2), and a second area 202 disposed on the opposite side of the folding area 203 (e.g., the right side of the folding area 203 of FIG. 2).

However, the segmentation of the display 200 as shown in FIG. 2 is merely an example, and the display 200 may be divided into a plurality of (e.g., four or more, or two) areas depending on a structure or a function of the display 200. For example, in the embodiment illustrated in FIG. 2, the display 200 may be divided into the areas by the folding area 203 or folding axis A-A' extending in parallel with the y axis but, in another embodiment, the display 200 may be divided into the areas with respect to another folding area (e.g., a folding area parallel with the x axis) or another folding axis (e.g., a folding axis parallel with the x axis).

According to an embodiment, the display 200 may be coupled with or disposed adjacent to a touch panel equipped with a touch detection circuit or a pressure sensor capable of measuring the strength (pressure) of a touch. For example, the display 200 may be disposed adjacent to or coupled with a digitizer panel, as an example of the touch pane, which detects a stylus pen of an electromagnetic resonance (EMR) type.

According to various embodiments, the first area 201 and the second area 202 may be overall symmetrical in shape with respect to the folding area 203. However, unlike the first area 201, the second area 202 may include a notch depending on the presence of the sensor area 324, but the rest may be symmetrical in shape with the first area 201. In other words, the first area 201 and the second area 202 may include symmetrical portions and asymmetrical portions.

Described below are the operation of the first housing 310 and the second housing 320 and each area of the display 200 depending on the state (e.g., the folded status, unfolded status, or intermediate status) of the electronic device 101.

According to various embodiments, when the electronic device 101 is in the unfolded status (e.g., FIG. 2), the first housing 310 and the second housing 320 may be disposed to face in the same direction while being angled at 180 degrees therebetween. The surface of the first area 201 and the surface of the second area 202 of the display 200 may be angled at 180 degrees therebetween while facing in the same direction (e.g., forward of the front surface of the electronic device). The folding area 203 may be coplanar with the first area 201 and the second area 202.

According to various embodiments, when the electronic device 101 is in the folded status (e.g., FIG. 3), the first housing 310 and the second housing 320 may face each other. For example, the surface of the first area 201 and the surface of the second area 202 of the display 200 may be angled at a small angle (e.g., between 0 degrees and 10 degrees) therebetween while facing each other. At least a portion of the folding area 203 may have a curved surface with a predetermined curvature.

According to various embodiments, in the intermediate status of the electronic device 101, the first housing 310 and the second housing 320 may be arranged at a certain angle therebetween. The surface of the first area 201 of the display 200 and the surface of the second area 202 may form an angle which is larger than the angle in the folded status and smaller than the angle in the unfolded status. The folding area 203 may at least partially have a curved surface with a predetermined curvature and, in this case, the curvature may be smaller than that when it is in the folded status.

Figure 4:
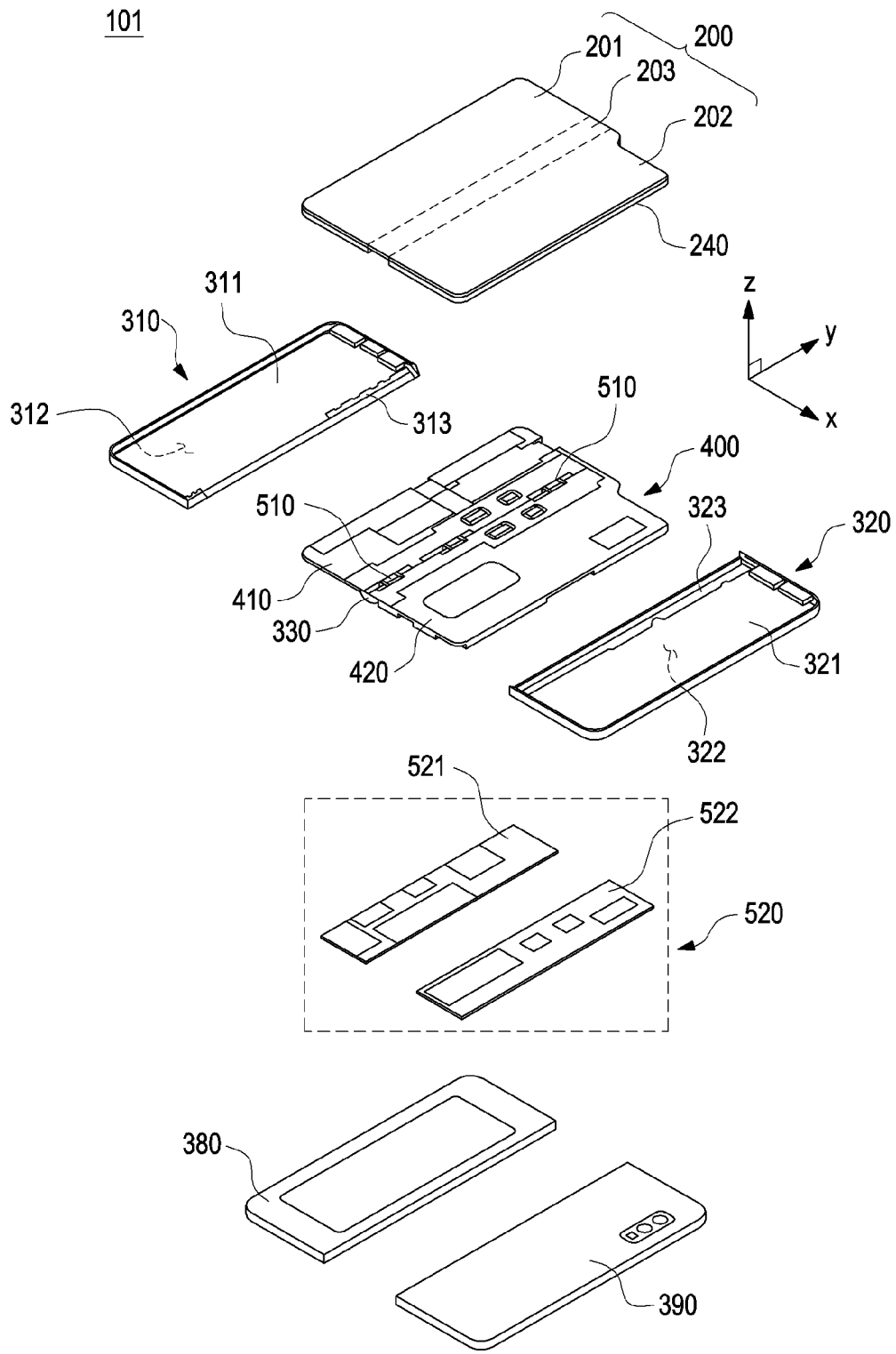
FIG. 4 is an exploded perspective view illustrating an electronic device according to various embodiments of the disclosure.

FIG. 4 is an exploded perspective view illustrating an electronic device 101 according to various embodiments of the disclosure.

Referring to FIG. 4, according to various embodiments, the electronic device 101 may include a foldable housing 300, a display device 200, and a board unit 520. The foldable housing may include a first housing 310, a second housing 320, a bracket assembly 400, a first rear cover 380, a second rear cover 390, and a hinge 510.

According to various embodiments, the display device 200 may include a display panel (e.g., a flexible display panel) and one or more plates or layers (e.g., a supporting plate 240) on which the display panel is seated. According to an embodiment, the supporting plate 240 may be disposed between the display panel and the bracket assembly 400. An adhesive may be positioned between the supporting plate 240 and the bracket assembly 400, attaching the supporting plate 240 and the bracket assembly 400.

According to various embodiments, the bracket assembly 400 may include a first bracket assembly 410 and a second bracket assembly 420. The hinge 510 may be disposed between the first bracket assembly 410 and the second bracket assembly 420, and when the hinge 510 is viewed from the outside, a hinge cover 330 covering the hinge 510 may be disposed. As another example, a printed circuit board (e.g., a flexible printed circuit (FPC)) may be disposed to cross the first bracket assembly 410 and the second bracket assembly 420.

According to various embodiments, the board unit 520 may include a first main circuit board 521 disposed on the first bracket assembly 410 and a second main circuit board 522 disposed on the second bracket assembly 420. The first main circuit board 521 and the second main circuit board 522 may be disposed in a space formed by the bracket assembly 400, the first housing 310, the second housing 320, the first rear cover 380, and the second rear cover 390. Components for implementing various functions of the electronic device 101 may be mounted on the first main circuit board 521 and the second main circuit board 522.

According to various embodiments, the first housing 310 and the second housing 320 may be assembled together to be coupled to two opposite sides of the bracket assembly 400, with the display 200 coupled to the bracket assembly 400. For example, the first housing 310 and the second housing 320 may slide to two opposite sides of the bracket assembly 400 and fit with the bracket assembly 400.

According to an embodiment, the first housing 310 may include a first surface 311 and a second surface 312 facing away from the first surface 311, and the second housing 320 may include a third surface 321 and a fourth surface 322 facing away from the third surface 321.

According to an embodiment, the first housing 310 may include a first rotation supporting surface 313, and the second housing 320 may include a second rotation supporting surface 323 corresponding to the first rotation supporting surface 313. The first rotation supporting surface 313 and the second rotation supporting surface 323 may include a curved surface corresponding to a curved surface included in the hinge cover 330.

According to an embodiment, the first rotation supporting surface 313 and the second rotation supporting surface 323, in the unfolded status of the electronic device 101 (e.g., the electronic device of FIG. 2), may cover the hinge cover 330, allowing the hinge cover 330 to be not or minimally exposed through the rear surface of the electronic device 101. As another example, the first rotation supporting surface 313 and the second rotation supporting surface 323, in the folded status of the electronic device 101 (e.g., the electronic device of FIG. 3), may rotate along the curved surface included in the hinge cover 330, allowing the hinge cover 330 to be maximally exposed through the rear surface of the electronic device 101.

Figure 5A:
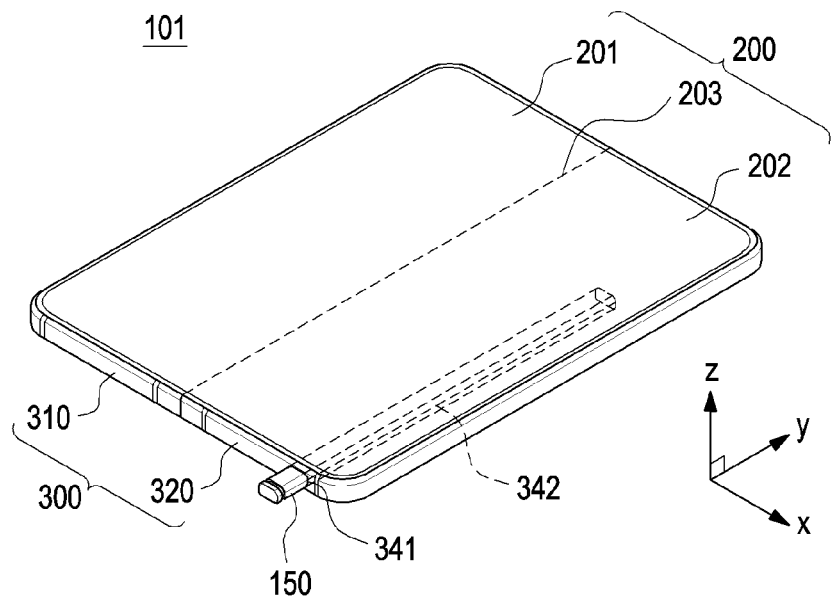
FIGS. 5A and 5B are perspective views illustrating an example of an electronic device in a fully unfolded status or a partially unfolded intermediate status, according to various embodiments of the disclosure.
Figure 5B:
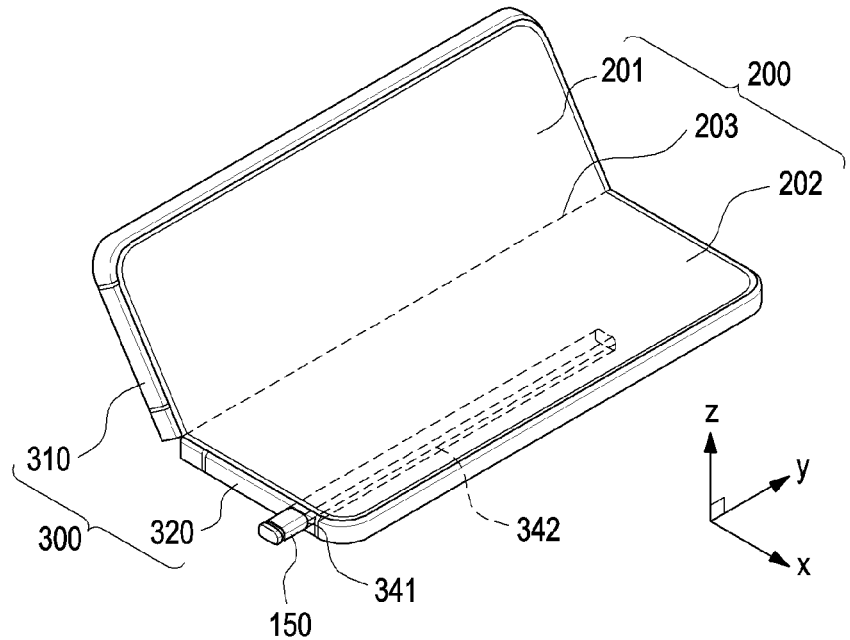

FIGS. 5A and 5B are perspective views illustrating an example of an electronic device in a fully unfolded status or a partially unfolded intermediate status, according to some embodiments of the disclosure. Specifically, FIG. 5A may illustrate an unfolded status of the electronic device 101, and FIG. 5B may illustrate a folded status of the electronic device 101.

Referring to FIGS. 5A and 5B, the electronic device 101 may include a foldable housing 300 and a flexible display 200. The electronic device 101 may transform to a folded status or an unfolded status. The electronic device 101 may be folded in two types, e.g., 'in-folding' in which it is folded so that the front surface of the electronic device 101 forms an acute angle and 'out-folding' in which it is folded so that the front surface of the electronic device 101 forms an obtuse angle, as viewed in the direction of the hinge axis (e.g., a direction parallel with the y axis). For example, in the in-fold state of the electronic device 101, the first surface (the first surface 311 of FIG. 4) may face the third surface (the third surface 321 of FIG. 4) and, in the fully unfolded status, the third direction may be identical to the first direction. As another example, in the out-folded status of the electronic device 101, the second surface (the second surface 312 of FIG. 4) may face the fourth surface (the fourth surface 322 of FIG. 4).

The in-folding type may mean a state in which the display 200 is not exposed to the outside in the fully folded status. The out-folding type may mean a state in which the display 200 is exposed to the outside in the fully folded status. FIG. 5B illustrates an intermediate status in which the electronic device 101 is partially unfolded during in-folding. Although the in-folded status of the electronic device 101 is described below for convenience purposes, it should be noted that the descriptions may also apply to the out-folded status of the electronic device 101.

According to various embodiments, the flexible display 200 may have a rectangular shape with rounded corners and a very narrow bezel area.

The flexible display 200 may include a first area 201 disposed in the first housing 310 and a second area 202 disposed in the second housing 320, and the first area 201 and the second area 202 may be implemented in the same shape. A border between the first area 201 and the second area 202 of the electronic device 101 may be made based on the folding area 203.

The configurations of the electronic device 101 of FIGS. 1 to 4 may be applied to the other configurations of the electronic device 101 of FIGS. 5A and 5B.

The user may perform entry to the first area 201 or second area 202 of FIGS. 5A and 5B using her body part (e.g., a hand) or an input device 150.

Referring to FIGS. 5A and 5B, according to various embodiments, a portion of the foldable housing 300 of the electronic device 101, e.g., a side portion, may have a hole 341. According to various embodiments, the foldable housing 300 may include a receiving space 342 exposed to the outside through the hole 341, and the input device 150 (e.g., a stylus pen) may be inserted into the electronic device 101 through the receiving space 342.

Figure 6A:
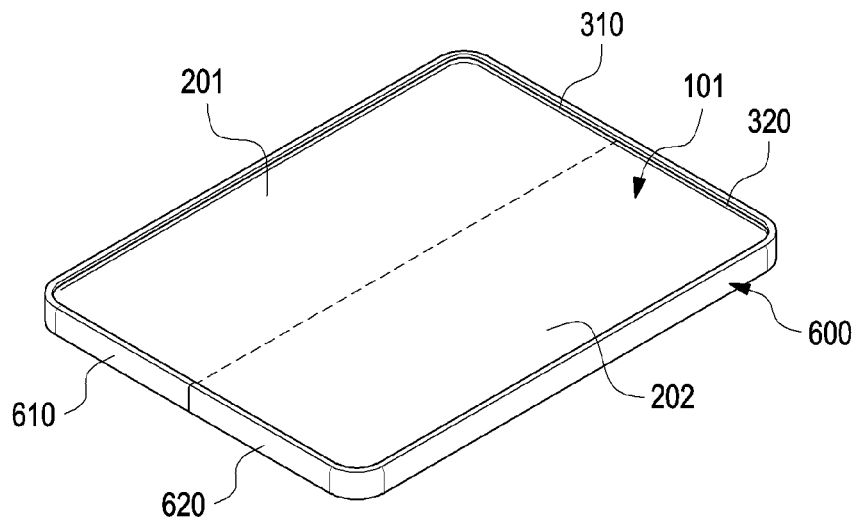
FIGS. 6A and 6B are perspective views illustrating an electronic device coupled with a case in a fully unfolded status or a partially unfolded intermediate status, according to various embodiments of the disclosure.
Figure 6B:
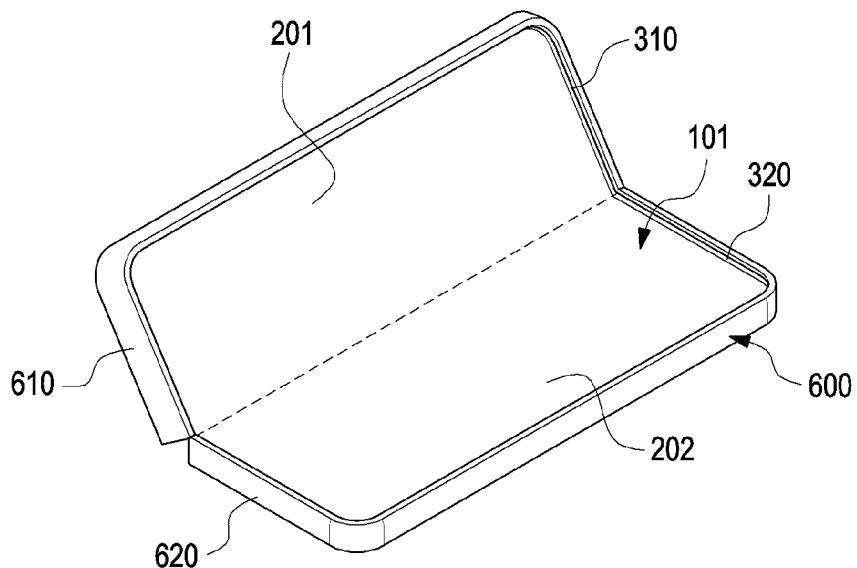

FIGS. 6A and 6B are perspective views illustrating an electronic device 101 coupled with a case 600 in a fully unfolded status or a partially unfolded intermediate status, according to various embodiments of the disclosure.

The case 600 may be a component to protect the electronic device 101 from external impact (e.g., physical and chemical) and that is formed with various colors or textures to give the electronic device an aesthetic look or to allow the user to stand out.

In addition to the foregoing effects, the case 600 may be provided to automatically fold or unfold the electronic device 101, which is a foldable electronic device, to allow the user to fold or unfold the foldable electronic device without using much effort.

Referring to FIGS. 6A and 6B together, the case 600 may include a first cover 610 for covering at least a portion of the electronic device 101 and a second cover 620 that covers at least a portion of the electronic device 101 and is foldable (or rotatable) about the first cover 610. According to an embodiment, the first cover 610 may be formed to surround at least a portion of the first housing 310 of the electronic device 101, and the second cover 620 may be formed to surround at least a portion of the second housing 320 of the electronic device 101.

The first cover 610 and the second cover 620 may be fully unfolded, at least partially folded, or fully folded from each other, as are the first housing 310 and the second housing 320. Although the drawings described below illustrate a structure in which the first cover 610 and the second cover 620 are folded in the in-folding type, embodiments of the disclosure are not limited, and they may be folded in the out-folding type as well. Described below is the in-folding type of the first cover 610 and the second cover 620 for ease of description.

The first cover 610 and the second cover 620 may form a space for receiving the electronic device 101 thereinside and may be configured so that when the electronic device 101 is received in the inner space of the first cover 610 and the second cover 620, one surface of the electronic device 101 (e.g., the front surface of the display) may be exposed to the outside. The display 200 may include a first area 201 disposed on one side of the folding axis (e.g., the folding axis A-A' of FIG. 2) and a second area 202 disposed on the opposite side of the folding axis. Although the electronic device 101 and the case 600 are coupled and the electronic device 101 is received in the inner space of the first cover 610 and the second cover 620 and surrounded, the first area 201 and the second area 202 may be exposed to the outside, displaying a screen.

The case 600 illustrated in FIGS. 6A and 6B may be a component corresponding to the electronic device 102 described above in connection with FIG. 1, in relation with the electronic device 101. Components included in the case 600 are described below in greater detail with reference to FIG. 7.

Figure 7:
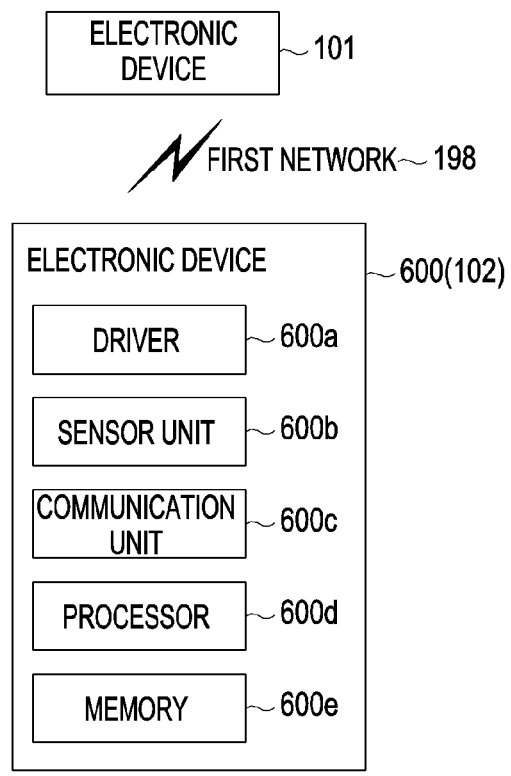
FIG. 7 is a block diagram illustrating an electronic device according to various embodiments of the disclosure.

FIG. 7 is a block diagram illustrating electronic devices 101 and 102 according to various embodiments of the disclosure. The electronic device 101 illustrated in FIG. 7 has been described in detail with reference to FIG. 1 and a description thereof may thus be omitted. The electronic device 102 illustrated in FIG. 7 may correspond to a case 600 according to various embodiments of the disclosure. The electronic device 101 and the case 600 (or the electronic device 102) may communicate with each other in the environment of the first network 198 (e.g., a near field wireless communication network).

The case 600 (or the electronic device 102) may include the first cover 610 and the second cover 620 illustrated in FIGS. 6A and 6B. The case 600 may further include a driver 600a for providing power so that the first cover 610 rotates about the second cover 620 or the second cover 620 rotates about the first cover 610. In addition to the driver 600a, the case 600 may include a sensor 600b, a communication unit 600c, a processor 600d, or a memory 600e. According to an embodiment, the communication unit 600c, the processor 600d, or the memory 600e may be mounted on a circuit board (e.g., a rigid or flexible circuit board) disposed inside the case 600. In one embodiment, the case 600 may omit at least one (e.g., the sensor 600b or the memory 600e) of the components or add one or more other components (e.g., an antenna (not shown)). In another embodiment, some of these components may be integrated into one component. For example, the communication unit 600c may be implemented to be, together with the antenna, embedded in the circuit board. The memory 600e may be implemented to be, along with the processor 600d, embedded in the circuit board.

According to various embodiments, the driver 600a may be disposed between the first cover 610 and the second cover 620 to connect the first cover 610 and the second cover 620, be integrally formed with the first cover 610 or the second cover 620, or be detachably formed from the first cover 610 or the second cover 620. The driver 600a according to the various embodiments may be divided into a hinge-type driver, a side-fixed driver, and a side-detachable driver according to embodiments. This is described below in detail with reference to embodiments of FIGS. 8 to 12.

The sensor 600b may detect an operating state (e.g., an angle of the electronic device) of the case 600 and may generate an electrical signal or data value corresponding to the detected state. The sensor 600b may include, e.g., a gyro sensor, an acceleration sensor, a resistance sensor, and an encoder. According to an embodiment, when the sensor 600b may include a resistance sensor, the sensor 600b may detect a change in resistance according to a bending angle of the case 600 and detect the angle between the first cover 610 and the second cover 620. The angle detection using the sensor 600b may be performed in real time or for a designated time when a specific application (a base application described below) is executed.

The communication unit 600c may support wireless communication between the case 600 and the external electronic device 101. Here, the wireless communication may be near field wireless communication and may include, e.g., Bluetooth standard or Bluetooth low energy (BLE) or Wi-Fi direct or infrared data association (IrDA). The communication unit 600c may be connected to the processor 600d. An antenna conductor (or an antenna radiator) not illustrated in the drawings may be separately provided and connected to the communication unit 600c according to an embodiment. In the disclosure, 'connection' may be a direct, indirect, communicable, electrical, or operative connection of some (e.g., a first) component to another (e.g., a second) component. Here, 'operatively connected' may mean that some (e.g., a first) component affects another (e.g., a second) component. According to another embodiment, the communication unit 600c may be integrated with an antenna conductor (or antenna radiator). Further, according to an embodiment, the communication unit 600c may be implemented in the form of a single or a plurality of chips.

The processor 600d may control at least one other component (e.g., the driver 600a) of the case 600 connected to the processor 600d and may perform various data processing or computation. According to an embodiment, as at least part of data processing or computation, the processor 600d may load, process, and store a command or data (e.g., first information or second information) received from another component (e.g., the sensor 600b or the communication unit 600c). According to an embodiment, the processor 600d may include a main processor (e.g., the main processor 121 of FIG. 1) and an auxiliary processor (e.g., the auxiliary processor 123 of FIG. 1 (e.g., a sensor hub processor or a communication processor)) operable independently from or together with the main processor. The description of the processor 120 of FIG. 1 may be applied to other features of the processor 600d.

The memory 600e may store various data used by at least one component (e.g., the processor 600d or the sensor 600b) of the case 600. According to various embodiments, the data may include an electric signal corresponding to execution of a base application, execution of a designated functional application (e.g., text messaging, call, navigation, or video viewing), and the angle of the case 600 detected using the sensor 600b or information related thereto and input data or output data for a command related thereto, as information related to the angle of the case 600. Additionally or alternatively, the data stored in the memory 600e may include an electric signal corresponding to the state detected for the ambient environment of the electronic device 101 or information related thereto and input data or output data for a command related thereto. According to an embodiment, the data stored in the memory 600e may include instructions that, when executed, enable the processor 600d to operate the driver according to first information and the second information related to the angle of the case 600 to adjust the angle between the first cover 610 and the second cover. The first information and the second information are described below with reference to FIG. 16.

According to various embodiments, the case 600 may omit some (e.g., the sensor 600b or the memory 600e) of the above-described components as described above. For example, when the sensor 600b is not included in the case 600, an operation to be performed by the sensor 600b and data obtained therethrough may be instead performed by, or obtained through, the sensor module (e.g., the sensor module 176 of FIG. 1) included in the electronic device 101. As another example, when the memory 600e is not included in the case 600, the role of the memory 600e may be replaced by a memory (e.g., the memory 130 of FIG. 1) included in the electronic device 101.

The first cover 610, the second cover 620, and the driver 600a included in the case 600 are described below in more detail.

Figure 8:
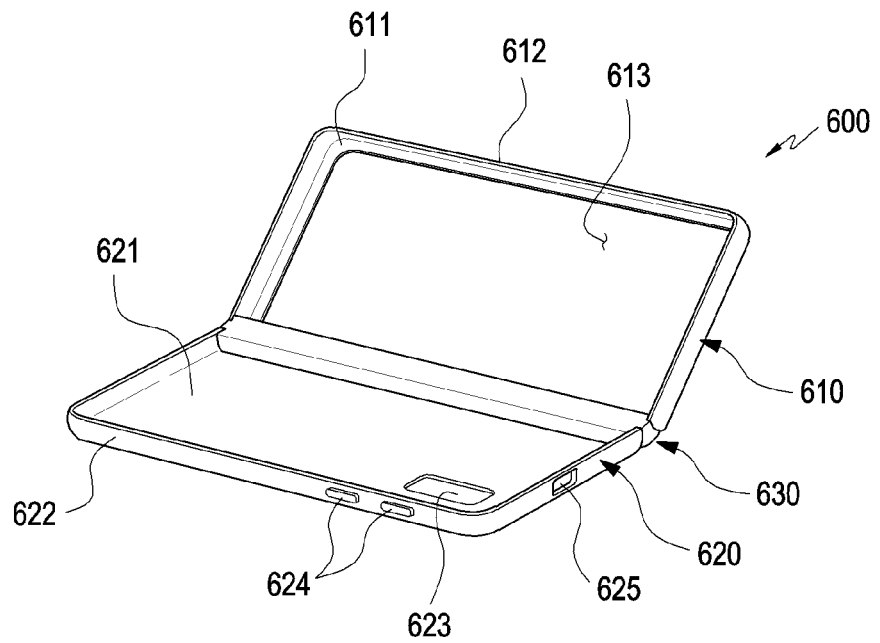
FIG. 8 is a perspective view illustrating an intermediate status in which a case including a hinge-type driver is partially unfolded according to an embodiment of the disclosure.

FIG. 8 is a perspective view illustrating an intermediate status in which a case 600 including a hinge-type driver 630 is partially unfolded according to an embodiment of the disclosure.

Referring to FIG. 8, the case 600 may include a first cover 610, a second cover 620 that is rotatable (or foldable or angle-adjustable) about the first cover 610, and a driver 630 for adjusting the angle between the first cover 610 and the second cover 620.

According to various embodiments, the first cover 610 may be formed to surround at least a portion of the first rear cover (the first rear cover 380 of FIG. 3) of the first housing (the first housing 310 of FIG. 3), and the second cover 620 may be formed to surround at least a portion of the second rear cover (the second rear cover 390 of FIG. 3) of the second housing (the second housing 320 of FIG. 3). The first cover 610 and/or the second cover 620 may form a space for receiving at least a portion of the electronic device 101 therein. According to an embodiment, the first cover 610 includes a first cover plate 611 and a first side member 612 extending from the first cover plate 611. In addition, the second cover 620 includes a second cover plate 621 and a second side member 622 extending from the second cover plate 621. When the case 600 accommodates at least a portion of the electronic device 101, the first side member 612 and the second side member 622 may surround at least a portion of the electronic device 101, respectively.

According to various embodiments, the first cover 610 may have a first opening 613, so that at least a portion of the first rear area (the first rear area 382 of FIG. 3) of the first rear cover (the first rear cover 380 of FIG. 3) of the electronic device 101 may be exposed. Even if the case 600 surrounds the electronic device 101, a sub display disposed in the first rear area (the first rear area 382 of FIG. 3) of the electronic device 101 may be visually exposed through the first opening 613. The size of the first opening 613 is not limited to any particular embodiment.

According to various embodiments, the second cover 620 may have a second opening 623, so that at least a portion of the second rear area (the second rear area 392 of FIG. 3) of the second rear cover (the second rear cover 390 of FIG. 3) of the electronic device 101 may be exposed. Although the case 600 receives the electronic device 101, one or more components or sensors (e.g., a proximity sensor and/or a rear camera) disposed in the second rear area (the second rear area 392 of FIG. 3) may be visually exposed through the second opening 623.

According to various embodiments, the first cover 610 and/or the second cover 620 may further include various input devices or openings. As an example of various input devices, an input button 624 may be formed on at least a portion of at least one cover (e.g., the second cover 620) to prevent the user from feeling uncomfortable upon pressing the input device (e.g., a side key) formed on a side surface of the electronic device 101 even when the case 600 surrounds the electronic device 101. As an embodiment of the various openings, a third opening 625 may be formed in at least one cover (e.g., the second cover 620) to prevent the user from feeling uncomfortable upon plugging a charging cable into the electronic device 101 even when the case 600 receives the electronic device 101.

Meanwhile, the driver 630 of FIG. 8 may be a hinge-type driver. The hinge-type driver, according to various embodiments, may include at least one actuator and a driver cover surrounding the at least one actuator.

The hinge-type driver 630 is described below in more detail with reference to the embodiments illustrated in FIGS. 9A to 10.

Figure 9A:
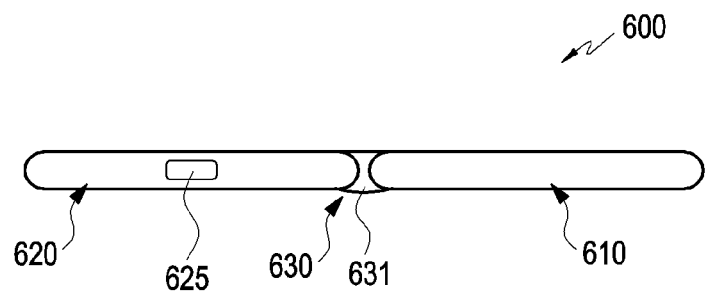
FIGS. 9A to 9C are views illustrating various operations of a case including a hinge-type driver according to an embodiment of the disclosure.
Figure 9B:
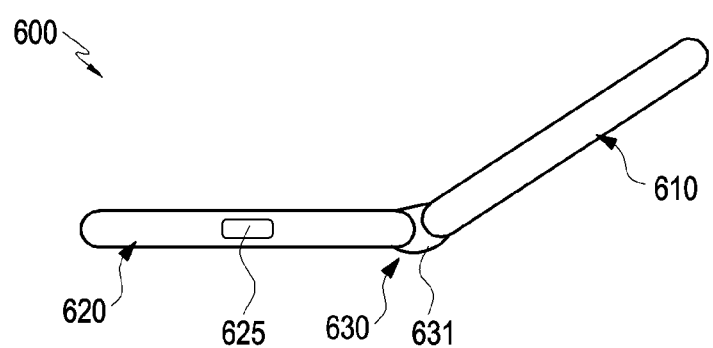
Figure 9C:
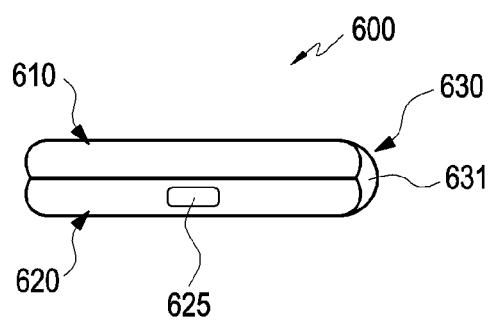

FIGS. 9A to 9C are views illustrating various operations of a case 600 including a hinge-type driver 630 according to an embodiment of the disclosure. FIG. 9A illustrates a state in which the case 600 is fully unfolded. FIG. 9B illustrates an intermediate status in which the case 600 is partially unfolded. FIG. 9C illustrates a state in which the case 600 is fully folded. FIGS. 9A to 9C may be side views of the case 600 of FIG. 8 as viewed from one side.

Referring to FIGS. 9A to 9C together, the hinge-type driver 630 may include a driver cover 631, and at least one actuator may be included in the inner space surrounded by the driver cover 631. Here, the at least one actuator may include various types of actuators, such as a motor and an electromagnet. According to an embodiment, the at least one actuator may provide power for adjusting the angle of the case by including a shape memory alloy or using at least a portion of a shape memory alloy.

As illustrated in FIGS. 9A to 9C, the first cover 610 and the second cover 620 may be connected to one side and the opposite side, respectively, of the hinge-type driver 630. The driver cover 631 may be configured to cover a hinge cover (e.g., the hinge cover 330 of FIG. 3) provided in the electronic device 101.

According to various embodiments, in addition to the at least one actuator, other components (e.g., a battery of the driver or a charging module) may be disposed in the inner space of the driver cover 631. According to another embodiment, at least one component of the sensor 600b, the communication unit 600c, the processor 600d, or the memory 600e included in the case 600 may be disposed in the inner space of the driver cover 631.

Figure 10:
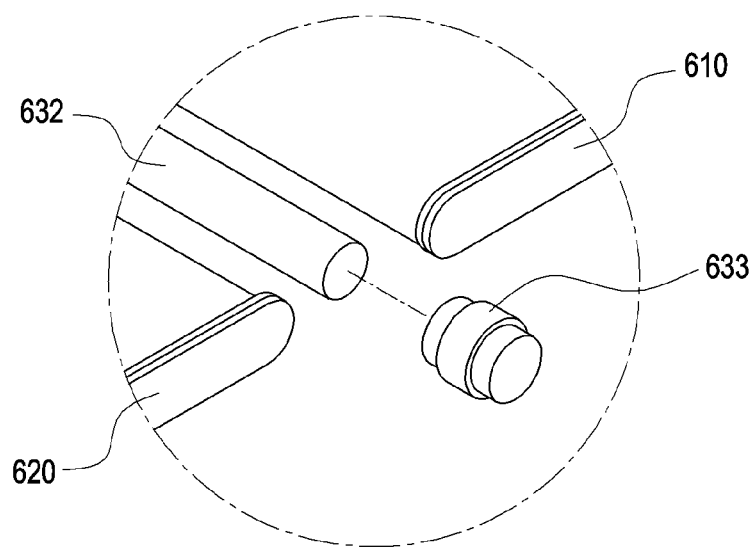
FIG. 10 is a perspective view illustrating an internal appearance of a hinge-type driver according to an embodiment of the disclosure.

FIG. 10 is a perspective view illustrating an internal appearance of a hinge-type driver (e.g., the hinge-type driver 630 of FIG. 8) according to an embodiment of the disclosure.

The hinge-type driver (e.g., the hinge-type driver 630 of FIG. 8) may include at least one rotation shaft 632 and at least one driving element 633 inside the driver cover (e.g., the driver cover 631 of FIGS. 9A to 9C). At least one driving element 633 may allow at least one of the first cover 610 or the second cover 620 to rotate (or fold) about the at least one rotation shaft 632 when the at least one rotation shaft 632 rotates. According to an embodiment, the at least one driving element 633 may include a gear element. For example, according to the embodiment illustrated in FIG. 10, the hinge-type driver may be coupled with the rotation shaft 632 and the driving element 633 and may include the driving element 633 synchronized with the rotation shaft 632. A gear element may be provided on the surface of the driving element 633 to be engaged with one side of the first cover 610 or one side of the second cover 620.

The embodiment of the hinge-type driver described above is merely an example and does not limit the scope of the present application. As long as it is provided in the case 600 and is able to adjust the angle between the first cover 610 and the second cover 620, other various types of hinge-type drivers than the embodiment illustrated in the drawings may be used.

Figure 11:
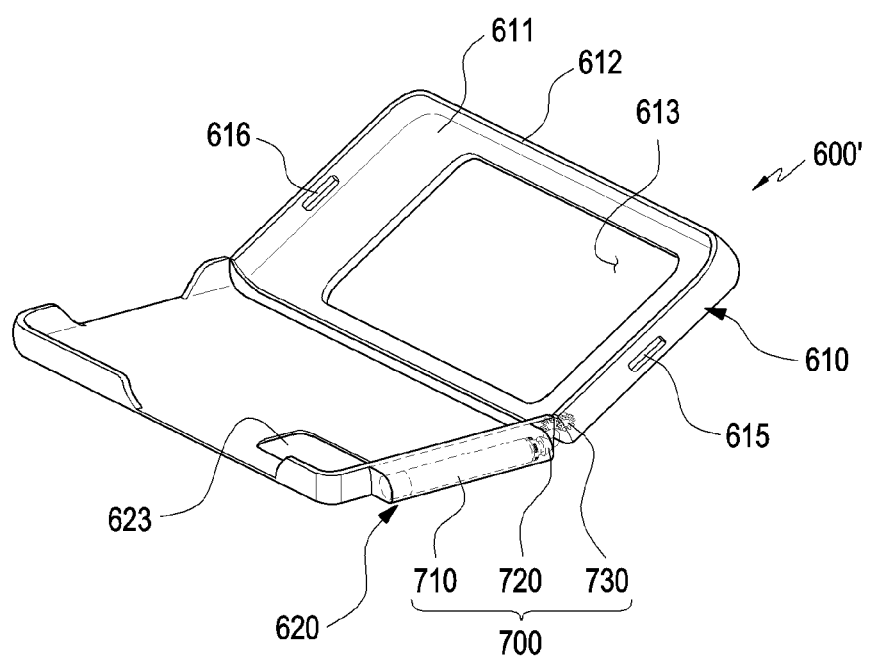
FIG. 11 is a perspective view illustrating an intermediate status in which a case including a side-fixed (or detachable) driver is partially unfolded according to another embodiment of the disclosure.

FIG. 11 is a perspective view illustrating an intermediate status in which a case 600' including a side-fixed (or detachable) driver is partially unfolded according to another embodiment of the disclosure.

Referring to FIG. 11, the case 600' may include a first cover 610, a second cover 620 that is rotatable (or foldable) about the first cover 610, and a driver 700 for adjusting the angle between the first cover 610 and the second cover 620.

According to various embodiments, the first cover 610 may be formed to surround at least a portion of the first rear cover (the first rear cover 380 of FIG. 3) of the first housing (the first housing 310 of FIG. 3), and the second cover 620 may be formed to surround at least a portion of the second rear cover (the second rear cover 390 of FIG. 3) of the second housing (the second housing 320 of FIG. 3). The first cover 610 and/or the second cover 620 may form a space for receiving at least a portion of the electronic device 101 therein.

The first cover 610 has a first opening 613. As described above through the embodiment illustrated in FIG. 8, the size and position of the first opening 613 may be varied depending on embodiments. The size and position of the second opening 623 provided in the second cover 620 may also be varied depending on embodiments. According to various embodiments, the first cover 610 and/or the second cover 620 may further include various input devices or openings. As an example of the various openings, a third opening 615 and a fourth opening 616 may be formed in at least one cover (e.g., the first cover 610) to prevent the user from feeling uncomfortable upon plugging a charging cable into the electronic device 101 even when the case 600 receives the electronic device 101.

According to various embodiments, a groove may be formed in at least a portion of the side structure of the second cover 620 so that the height of the side structure is not constant but is stepped. For example, as in the embodiment illustrated in FIG. 11, grooves may be formed in all other side surfaces of the second cover 620 except for the side surface on which the driver 700 is disposed. The grooves allow the user to smoothly attach/detach the electronic device (e.g., the electronic device 101 of FIG. 6A) to/from the case 600.

The description of the embodiment of FIG. 8 may be applied to the rest of the first cover 610 and the second cover 620.

Meanwhile, the driver 700 of FIG. 11 may be a side-fixed (or detachable) driver. Unlike the hinge-type driver, the side-fixed (or detachable) driver may not include driver covers connected to the first cover 610 and the second cover 620, respectively.

The side-fixed (or detachable) driver 700 may include at least one actuator 710, a power transfer unit 720, and a gear 730. The side-fixed (or detachable) driver 700 is described below in more detail with reference to the embodiment illustrated in FIG. 12.

Figure 12:
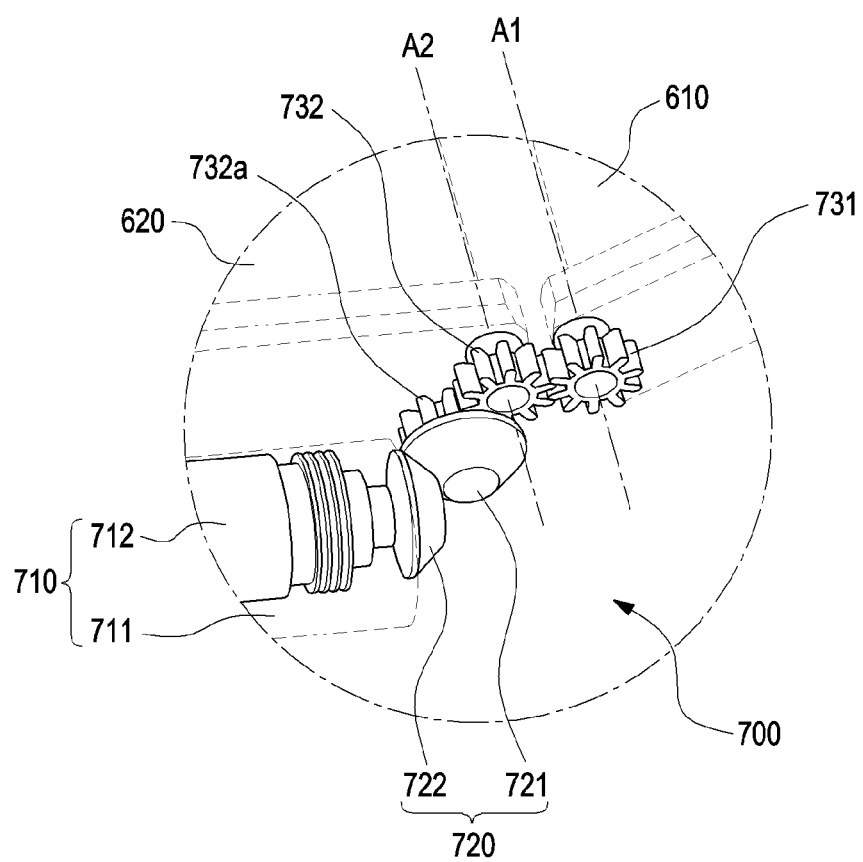
FIG. 12 is a perspective view illustrating a side-fixed (or detachable) driver according to another embodiment of the disclosure.

FIG. 12 is a perspective view illustrating a side-fixed (or detachable) driver 700 according to another embodiment of the disclosure.

The side-fixed (or detachable) driver 700 may include at least one actuator 710 coupled to the first cover (first cover 610 of FIG. 11) or the second cover (second cover 620 of FIG. 11), gear 730 disposed the rotation shaft of the first cover 610 and the rotation shaft of the second cover 620, respectively, and a power transfer unit 720 transferring the power generated from the at least one actuator 710 to the gear 730.

At least one actuator 710 may include an actuator unit 711 and an actuator housing 712 receiving the actuator unit 711. The actuator housing 712 may be coupled to one of the first cover 610 or the second cover 620. At least one actuator 711 is a power generating part and may be a component that transfers the power generated according to a command input to the at least one actuator 711 to the power transfer unit 720.

Referring to FIGS. 11 and 12 together, at least one actuator 710 may be a bar-type actuator that has a height corresponding to the side structure of the first cover 610 or the second cover 620 and extends along one direction (e.g., a vertical direction) of the side structure of the first cover 610 or the second cover 620. Although it is illustrated in the drawings that one actuator 710 is attached to one side of the second cover 620, this is merely an embodiment and embodiments of the disclosure are not limited thereto. According to various embodiments, unlike what is illustrated in FIG. 11, the actuator 710 may be attached to one side surface of the first cover 610, or a plurality of actuators may be provided to be coupled with a plurality of portions of the first cover 610 and/or the second cover 620.

The case 600 may include, and rotate about, at least one rotation axis when the second cover 620 is rotatable (foldable) about the first cover 610. For example, as illustrated in FIG. 12, the case 600 may perform the angle adjustment operation, with a first rotation axis A1 formed in the first cover 610 and a second rotation axis A2 formed in the second cover 620. However, it should be noted that the present invention is not necessarily limited thereto. As another embodiment, e.g., in the cases where at least a portion of the first cover 610 overlaps at least a portion of the second cover 620, an embodiment in which the first cover 610 and the second cover 620 share one rotation axis also belongs to the category of the present application.

In the example state in which the first rotation axis A1 is formed in the first cover 610, and the second rotation axis A2 is formed in the second cover 620, the gear 730 may include a first gear 731 sharing the first rotation axis A1 and a second gear 732 sharing the second rotation axis A2. Further, an additional gear structure (e.g., second gear 732a) may be additionally included in a predetermined portion of the first cover 610 and/or the second cover 620 for smooth power transfer.

The power transfer unit 720 is a part that transfers power between the actuator 710 and the gear 730 and may be formed in various manners considering the arrangement and shape of the components constituting the actuator 710 and the gear 730. For example, the power transfer unit 720 may include a first power transfer unit 721 connected to the additional gear 732a and a second power transfer unit 722 connected to the actuator unit 712, as illustrated in FIG. 12.

According to various embodiments, at least a portion of the surface of the component constituting the power transfer unit 720 is provided with gear teeth, and at least a portion of the surface of the component constituting the gear 730 may be provided with gear teeth and, during mutual operation, the gear teeth may engage with each other. It should be noted that the above-described embodiments are merely examples to help understand the components of the present invention, and do not limit the scope of the present invention.

Meanwhile, the side-fixed (or detachable) driver 700 may be configured to be detachably attached to the first cover 610 and/or the second cover 620 as needed. For example, when the power of the driver is insufficient, the battery in the driver may be recharged and the driver may then be attached back.

A method for operating the foldable electronic device (e.g., the electronic device 101 of FIG. 1) and the case 600 according to various embodiments of the disclosure is described below in detail with reference to FIGS. 13A to 19.

Figure 13A:
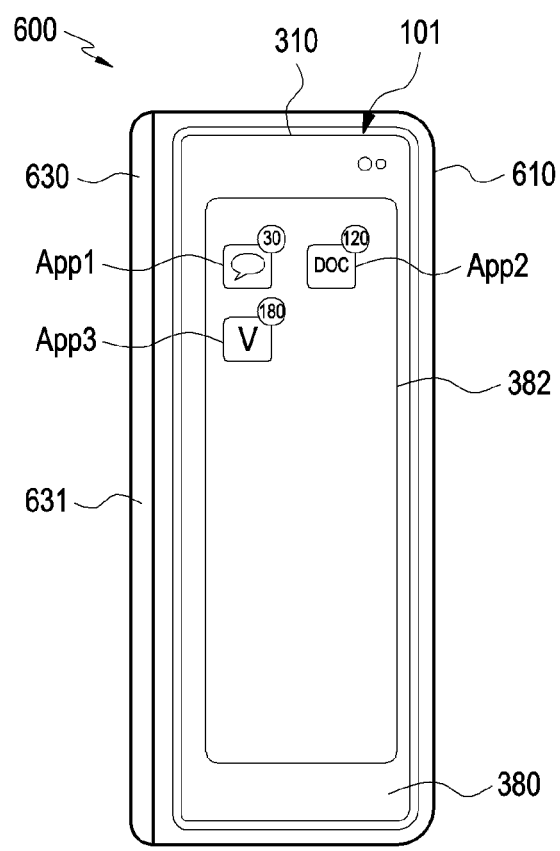
FIGS. 13A and 13B are views illustrating various applications displayed on a display of an electronic device according to various embodiments of the disclosure.
Figure 13B:
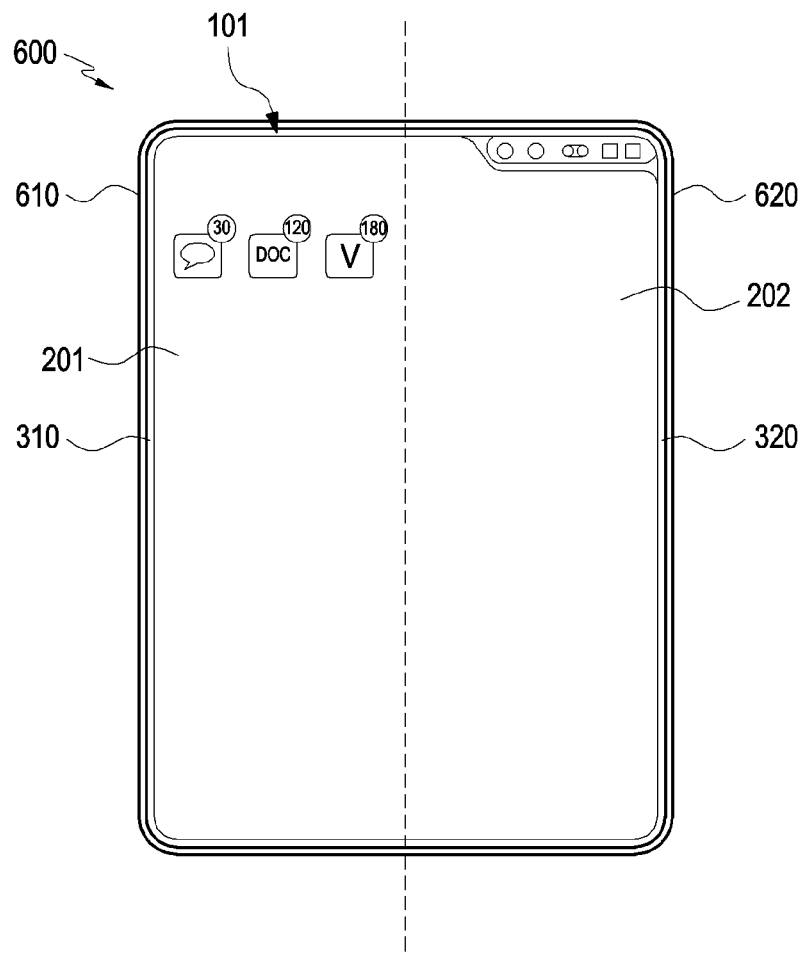

FIGS. 13A and 13B are views illustrating various applications displayed on a display of an electronic device 101 according to various embodiments of the disclosure.

According to various embodiments of the disclosure, the case 600 allows the user to fold or unfold the electronic device automatically or without much effort as a designated application installed on the electronic device 101 runs, with the electronic device 101 received in the case 600.

The operation in which the case 600 unfolds or folds the electronic device 101 may be performed regardless of whether the electronic device 101 and the case 600 are in the folded status, at least partially unfolded intermediate status, or unfolded status or whether the electronic device 101 and the case 600 are in the in-folding state or out-folding state.

As illustrated in FIG. 13A, according to various embodiments, in an example where the case 600 and the electronic device 101 are together in the fully folded status, a plurality of functional applications may be displayed on the display (e.g., the sub display) exposed on the first rear area 382 of the first rear cover 380. If the user presses a specific functional application, with the plurality of functional applications displayed on the display, the case may be operated so that the angle formed by the foldable electronic device forms an angle corresponding to the functional application. Here, the angle corresponding to the functional application may be previously designated and stored in a memory (the memory 600e of FIG. 6). Such an operation may likewise be performed even in a state in which the case 600 and the electronic device 101 together are fully unfolded. According to the embodiment illustrated in FIG. 13B, a plurality of functional applications may also be displayed on the display exposed on the front surface.

According to various embodiments, the functional applications may include various applications including text messaging, phone, navigation, document, or video viewing. According to an embodiment, an application for performing the operation in which the case adjusts the angle of the foldable electronic device may be previously designated from among the plurality of functional applications displayed on the display. Referring to FIGS. 13A and 13B, e.g., a plurality of designated functional applications displayed may include a text message (App1), a document (App2), and a video (App3).

According to various embodiments of the disclosure, as the user selects any one functional application from among the plurality of functional applications, the case 600 may perform the operation of adjusting the electronic device 101 to a designated angle. Here, the 'operation in which the case 600 adjusts the electronic device 101 to a designated angle' may mean the operation of adjusting the angle between the first housing (e.g., the first structure 310 of FIG. 6A) and the second housing (e.g., the second housing 320) received in the case 600 to the designated angle by adjusting the angle between the first cover 610 and the second cover 620 to the designated angle. Meanwhile, the 'angle formed by the foldable electronic device' as used in the disclosure may mean the angle between the first housing (e.g., the first housing 310 of FIG. 6A) and the second housing (e.g., the second housing 320). According to an embodiment, the angle between the first housing (e.g., the first housing 310 of FIG. 6A) and the second housing (e.g., the second housing 320) may be substantially the same as the angle between the first cover 610 and the second cover 620.

According to an embodiment, if the angle formed by the foldable electronic device is a specific angle, the user may feel uncomfortable in running a specific functional application to implement the function. For example, in the case of text messaging, the user may feel most comfortable in creating a text message when the angle formed by the foldable electronic device is 0 degrees or 30 degrees. As another example, the user may feel most comfortable in creating a document when the angle formed by the foldable electronic device is 120 degrees. Further, by way of example, the user desires to view video in the largest screen without fatigue. The optimal angle which needs to be formed by the foldable electronic device for viewing video may be, e.g., 180 degrees. In other words, the user may feel most comfortable when the angle formed by the foldable electronic device is 180 degrees in implementing a video viewing function.

According to an embodiment, each of the functional applications may display the optimal angle corresponding to the functional application, as the angle formed by the foldable electronic device. For example, as illustrated in FIGS. 13A and 13B, an optimal angle of 30 degrees may be previously designated for the text message (App1), an optimal angle of 120 degrees may be previously designated for the document (App2), and an optimal angle of 180 degrees may be previously designated for the video (App3). Other various embodiments are possible.

In the above examples, an optimal angle for a specific function application may be arbitrarily pre-designated according to the user's intention or preference or, as described below, the optimal angle may be automatically designated and used as a learning effect according to the repeated execution of the same function application at the corresponding angle.

Figure 14:
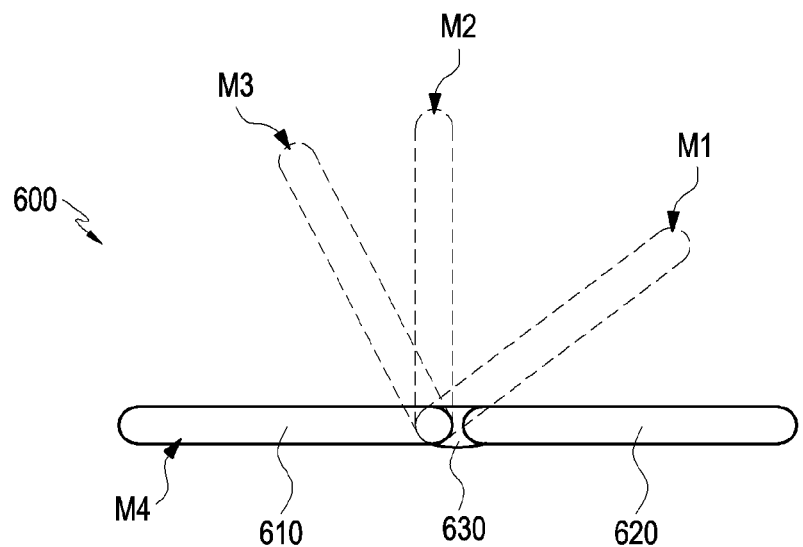
FIG. 14 is a view schematically illustrating a state in which an electronic device is folded at various angles, according to various embodiments of the disclosure.
Figure 15:
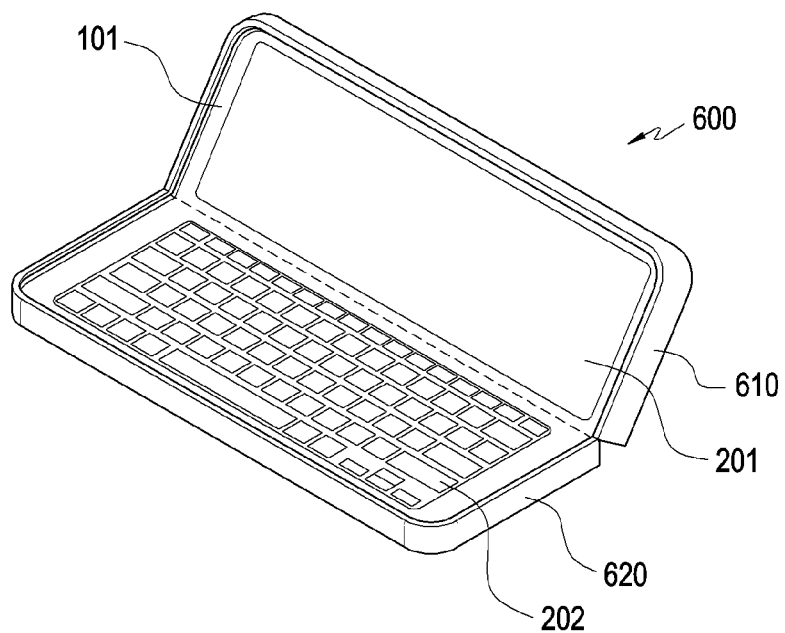
FIG. 15 is a perspective view illustrating a screen displayed on a display when an application is executed on an electronic device according to an embodiment of the disclosure.

FIG. 14 is a view schematically illustrating a state in which an electronic device is folded at various angles, according to various embodiments of the disclosure. FIG. 15 is a perspective view illustrating a screen displayed on a display when an application is executed on an electronic device 101 according to an embodiment of the disclosure.

Referring to FIG. 14, the case 600 may be automatically folded or unfolded to form various angles between the first cover 610 and the second cover 620 forms various angles and, if a designated application is executed, maintain a designated angle corresponding thereto for a predetermined time. Maintaining it for a predetermined time is to maintain a mode for performing a function of a specific application and may be referred to as a first mode M1, a second mode M2, a third mode M3, or a fourth mode M4 depending on various angles as illustrated in FIG. 14. Here, the first mode M1 may refer to a state in which the angle formed by the foldable electronic device is 30 degrees, and the second mode M2 refers to a state in which the angle formed by the foldable electronic device is 90 degrees. The third mode M3 may refer to a state in which the angle formed by the foldable electronic device is 120 degrees. Further, the fourth mode M3 may refer to a state in which the angle formed by the foldable electronic device is 180 degrees.

According to the embodiment illustrated in FIG. 15, when the user executes a document functional application included in the foldable electronic device 101, the case 600 may adjust the angle formed by the foldable electronic device 101 to a designated angle (e.g., 120 degrees) (or the third mode M3) and allow the angle to be maintained for a predetermined time or longer. As a functional application is executed, the foldable electronic device 101 may display a document create screen on the display in the first area 201 and a keypad on the display in the second area 202.

Figure 16:
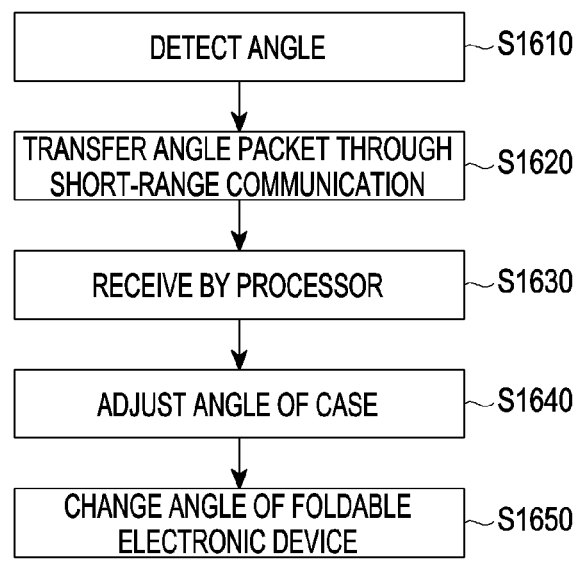
FIG. 16 is a flowchart illustrating a method for operating a case for a foldable electronic device according to an embodiment of the disclosure.
Figure 17:
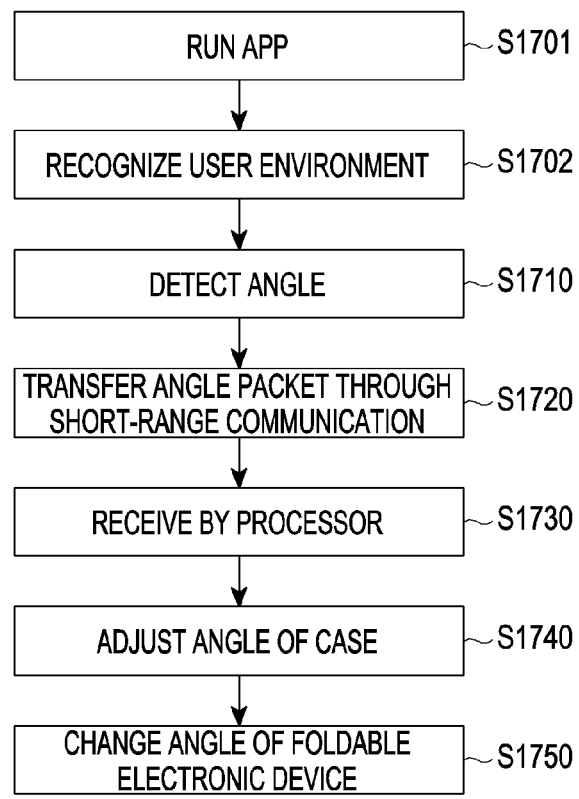
FIG. 17 is a flowchart illustrating a method for operating a case for a foldable electronic device according to another embodiment of the disclosure.
Figure 18:
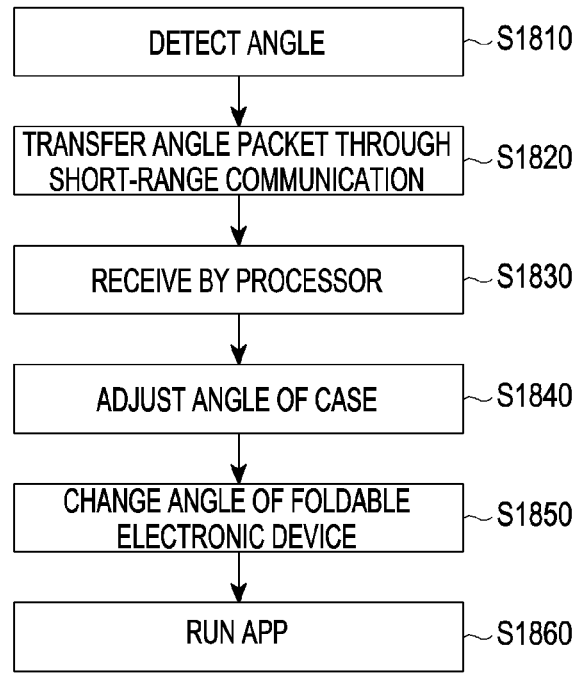
FIG. 18 is a flowchart illustrating a method for operating a case for a foldable electronic device according to still another embodiment of the disclosure.

FIG. 16 is a flowchart illustrating a method for operating a case for a foldable electronic device according to an embodiment of the disclosure. FIG. 17 is a flowchart illustrating a method for operating a case for a foldable electronic device according to another embodiment of the disclosure. FIG. 18 is a flowchart illustrating a method for operating a case for a foldable electronic device according to still another embodiment of the disclosure.

Referring to FIG. 16, according to various embodiments of the disclosure, a method for operating a case for a foldable electronic device may include an operation S1610 of detecting an angle of the foldable electronic device, an operation S1620 of transferring an angle packet through short-range communication, an operation S1630 of receiving by the processor, an operation S1640 of adjusting an angle by the case, and an operation S1650 of changing the angle by the foldable electronic device.

In relation to the operation S1610 of detecting the angle of the foldable electronic device, the detection of the angle of the foldable electronic device may be performed through a sensor module (e.g., the sensor module 176 of FIG. 1) provided in the foldable electronic device or a sensor (e.g., the sensor 600b of FIG. 7) provided in the case.

In relation to the operation S1620 of transferring the angle packet through short-range communication, the short-range communication may mean short-range communication between the foldable electronic device and the case. The case may receive information (e.g., first information) for generating an angle corresponding to a functional application executed on the foldable electronic device, and the foldable electronic device may receive information (e.g., second information) detected through a sensor provided in the case.

In relation to the operation S1630 of receiving by the processor, the processor may include at least one of the processor 120 included in the foldable electronic device or the processor 600d included in the case. The processors 120 and 600d may transfer angle adjustment commands to the case based on the first information and the second information.

In relation to the operation S1640 of adjusting the angle of the case, the processor may give an angle adjustment command to the driver 600a provided in the case, adjusting the angle between the first cover and the second cover.

In relation to changing (S1650) the angle of the foldable electronic device, if the angle between the first cover and the second cover is adjusted, the angle between the first housing and the second housing of the foldable electronic device may be adjusted.

Such operations S1610 to S1650 may be performed in the same manner in some operations of FIGS. 17 and 18 (S1810-S1860).

Unlike in FIG. 16, in FIG. 17, the operations (S1702-S1750) are performed after a function application is executed (S1701 and, in FIG. 18, the function application (S1860) is performed after the operations (S1810-S1850) are performed.

Figure 19:
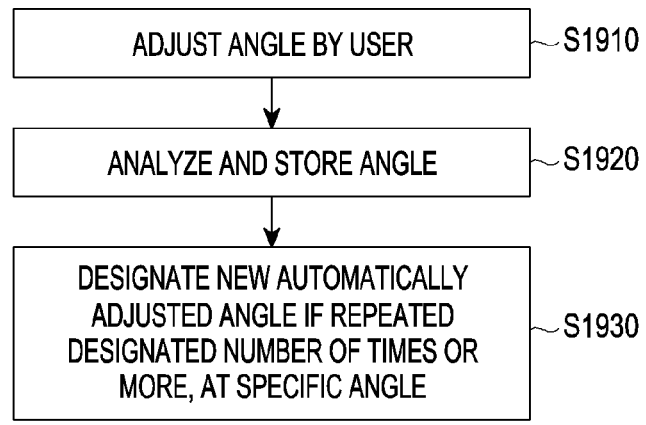
FIG. 19 is a flowchart illustrating a method for learning angles of a case for a foldable electronic device according to an embodiment of the disclosure.

FIG. 19 is a flowchart illustrating a method for learning angles of a case for a foldable electronic device according to an embodiment of the disclosure. FIG. 19 include operations S1910-S1930.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various embodiments of the disclosure, there may be provided a case for a foldable electronic device including a first housing and a second housing rotatable with the first housing, comprising a first cover surrounding at least a portion of the first housing, a second cover surrounding at least a portion of the second housing and rotatable about the first cover, a driver configured to adjust an angle between the first cover and the second cover, a communication unit configured to transmit first information related to the angle for a folded status of the foldable electronic device to the foldable electronic device, or receive the first information from the foldable electronic device; and at least one processor connected with the communication unit and configured to receive the first information related to the angle to operate the driver.

According to various embodiments, the case may further comprise a sensor configured to detect an angle between the first housing and the second housing.

According to various embodiments, the processor may be configured to operate the driver based at least partially on second information related to the angle between the first housing and the second housing detected by the sensor.

According to various embodiments, the at least one processor may be configured to receive the first information related to the angle from the foldable electronic device through the communication unit for a designated time when the communication unit is activated and compute an angle to be adjusted between the first housing and the second housing using the first information and the second information to operate the driver.

According to various embodiments, the communication unit may be activated when a signal of short-range wireless communication is received by the communication unit.

According to various embodiments, the short-range wireless communication may be configured to support a Bluetooth standard, Bluetooth low energy (BLE), Wi-Fi direct, or infrared data association (IrDA).

According to various embodiments, the case may further comprise a memory connected with the at least one processor.

According to various embodiments, the memory may store instructions to enable the processor to control the driver to form a designated angle between the first housing and the second housing according to an angle corresponding to a task of a designated functional application installed on the foldable electronic device when the designated functional application is executed.

According to various embodiments, the memory may store instructions to enable the foldable electronic device to execute an application corresponding to a designated angle when an angle between the first housing and the second housing is detected as the designated angle for a designated time.

According to various embodiments, the memory may be configured to perform the instructions when a base application installed on the foldable electronic device is executed.

According to various embodiments, the instructions may include instructions to enable the processor to compute an angle to be adjusted between the first housing and the second housing further considering third information related to a user environment around the foldable electronic device.

According to various embodiments, the driver may be a hinge-type driver positioned between the first cover and the second cover and coupled with each of the first cover and the second cover.

According to various embodiments, the case may further comprise a case hinge cover surrounding the driver.

According to various embodiments, the driver may be a side-fixed driver fixed to a side surface of the case or a side-removable driver detachable from a side surface of the case.

According to various embodiments, the driver may include at least one actuator coupled to the first cover or the second cover, a gear disposed on each of a rotation shaft of the first cover and a rotation shaft of the second cover, and a power transfer unit configured to transfer power generated by the at least one actuator to the gear unit.

According to various embodiments of the disclosure, there may be provided a case for a foldable electronic device including a first housing and a second housing rotatable with the first housing, comprising a first cover surrounding at least a portion of the foldable electronic device, a second cover surrounding at least a portion of the foldable electronic device and rotatable about the first cover, a sensor for detecting an angle between the first housing and the second housing, a driver for adjusting an angle between the first cover and the second cover, a communication unit for transmitting first information related to the angle to the foldable electronic device, or receiving the first information from the foldable electronic device, at least one processor connected with the communication unit and, if the communication unit is activated, receiving the first information related to the angle and driving the driver based on at least a portion of second information related to the angle detected between the first housing and the second housing, and a memory connected with the processor, wherein the memory includes instructions that, when executed, enable the processor to operate the driver according to the first information related to the angle and the second information to adjust the angle between the first cover and the second cover.

According to various embodiments, the communication unit may be activated when a signal of short-range wireless communication is received by the communication unit.

According to various embodiments, the short-range wireless communication may be configured to support a Bluetooth standard or Bluetooth low energy (BLE) or Wi-Fi.

According to various embodiments, the memory may be configured to perform the instructions when a base application installed on the foldable electronic device is executed.

According to various embodiments, the instructions may include instructions to enable the processor to compute an angle to be adjusted between the first housing and the second housing further considering third information related to a user environment around the foldable electronic device.

It is apparent to one of ordinary skill in the art that the camera modules according to various embodiments of the present invention as described above are not limited to the above-described embodiments and those shown in the drawings, and various changes, modifications, or alterations may be made thereto without departing from the scope of the present invention.

Although the present disclosure has been described with various embodiments, various changes and modifications may be suggested to one skilled in the art. It is intended that the present disclosure encompass such changes and modifications as fall within the scope of the appended claims.

What is claimed is:

1. A case for a foldable electronic device including:
a first housing;
a second housing rotatable with the first housing;
a first cover surrounding at least a portion of the first housing;
a second cover surrounding at least a portion of the second housing and rotatable about the first cover;
a driver configured to adjust an angle between the first cover and the second cover;
a communication unit configured to:
transmit first information related to the angle for a folded status of the foldable electronic device to the foldable electronic device, and
receive the first information from the foldable electronic device; and
at least one processor coupled with the communication unit and configured to receive the first information related to the angle to operate the driver.

2. The case of claim 1, further comprising a sensor configured to detect an angle between the first housing and the second housing.

3. The case of claim 2, wherein the processor is configured to operate the driver based at least partially on second information related to the angle between the first housing and the second housing detected by the sensor.

4. The case of claim 3, wherein the at least one processor is configured to:
receive the first information related to the angle from the foldable electronic device through the communication unit for a designated time when the communication unit is activated, and
compute an angle to be adjusted between the first housing and the second housing using the first information and the second information to operate the driver.

5. The case of claim 4, wherein the communication unit is configured to activate when a signal of a near field wireless communication is received by the communication unit.

6. The case of claim 5, wherein the near field wireless communication is configured to support a Bluetooth standard, Bluetooth low energy (BLE), Wi-Fi direct, or infrared data association (IrDA).

7. The case of claim 1, further comprising a memory coupled with the at least one processor.

8. The case of claim 7, wherein the memory is configured to store instructions to enable the processor to control the driver to form a designated angle between the first housing and the second housing according to an angle corresponding to a task of a designated functional application installed on the foldable electronic device when the designated functional application is executed.

9. The case of claim 8, wherein the memory is configured to perform the instructions when a base application installed on the foldable electronic device is executed.

10. The case of claim 8, wherein the instructions include instructions to enable the at least one processor to compute an angle to be adjusted between the first housing and the second housing further considering third information related to a user environment around the foldable electronic device.

11. The case of claim 7, wherein the memory is configured to store instructions to enable the foldable electronic device to execute an application corresponding to a designated angle when an angle between the first housing and the second housing is detected as the designated angle for a designated time.

12. The case of claim 1, wherein the driver is a hinge-type driver positioned between the first cover and the second cover and coupled with each of the first cover and the second cover.

13. The case of claim 12, further comprising a case hinge cover surrounding the driver.

14. The case of claim 1, wherein the driver includes:
a side-fixed driver fixed to a side surface of the case, or
a side-removable driver detachable from a side surface of the case.

15. The case of claim 14, wherein the driver includes:
at least one actuator coupled to the first cover or the second cover,
a gear disposed on each of a rotation shaft of the first cover and a rotation shaft of the second cover, and
a power transfer unit configured to transfer power generated by the at least one actuator to the gear.

16. A case for a foldable electronic device including:
a first housing;
a second housing rotatable with the first housing;
a first cover surrounding at least a portion of the foldable electronic device;
a second cover surrounding at least a portion of the foldable electronic device and rotatable about the first cover,
a sensor for detecting an angle between the first housing and the second housing;
a driver for adjusting an angle between the first cover and the second cover;
a communication unit configured to:
transmit first information related to the angle to the foldable electronic device, and
receive the first information from the foldable electronic device;
at least one processor connected with the communication unit and configured to, if the communication unit is activated, receive the first information related to the angle and driving the driver based on at least a portion of second information related to the angle detected between the first housing and the second housing; and
a memory connected with the processor, wherein the memory includes instructions that, when executed, enable the processor to operate the driver according to the first information related to the angle and the second information to adjust the angle between the first cover and the second cover.

17. The case of claim 16, wherein the communication unit is configured to activate when a signal of a short-range wireless communication is received by the communication unit.

18. The case of claim 17, wherein the short-range wireless communication may be configured to support a Bluetooth standard, Bluetooth low energy (BLE), or Wi-Fi.

19. The case of claim 16, wherein the memory may be configured to perform the instructions when a base application installed on the foldable electronic device is executed.

20. The case of claim 16, wherein the instructions may include instructions to enable the processor to compute an angle to be adjusted between the first housing and the second housing further considering third information related to a user environment around the foldable electronic device.

* * * * *